(12) United States Patent
Huang et al.

(10) Patent No.: US 7,893,006 B2
(45) Date of Patent: Feb. 22, 2011

(54) SYSTEMS AND METHODS FOR SOLUTION-BASED DEPOSITION OF METALLIC CAP LAYERS FOR HIGH TEMPERATURE SUPERCONDUCTOR WIRES

(75) Inventors: Yibing Huang, Northborough, MA (US); Thomas Kodenkandath, N. Grafton, MA (US); Joseph Lynch, Medford, MA (US); Martin W. Rupich, Framingham, MA (US); Wei Zhang, Shrewsbury, MA (US)

(73) Assignee: American Superconductor Corporation, Devens, MA (US)

( * ) Notice: Subject to any disclaimer, the term of this patent is extended or adjusted under 35 U.S.C. 154(b) by 884 days.

(21) Appl. No.: 11/728,108

(22) Filed: Mar. 23, 2007

(65) Prior Publication Data

US 2009/0233800 A1    Sep. 17, 2009

(51) Int. Cl.
  *H01L 39/24* (2006.01)
  *H01B 12/00* (2006.01)
(52) U.S. Cl. .................. 505/470; 505/471; 505/473; 505/430; 505/431; 505/434; 505/445; 505/730; 505/736; 505/704; 505/230; 505/236; 427/62; 427/118; 427/123; 427/124; 427/125; 427/191; 427/205; 427/229; 427/250; 174/125.1; 29/599
(58) Field of Classification Search .............. 505/210, 505/220, 236–238, 425, 434, 445–446, 734–736, 505/150, 230–231, 329, 470–477; 428/699–701, 428/930; 427/62, 123–125, 189–191, 202–205, 427/229, 250, 117–118, 180; 252/512–514; 174/125.1; 29/599
See application file for complete search history.

(56) References Cited

U.S. PATENT DOCUMENTS 5,071,826 A * 12/1991 Anderson et al. ........... 505/445

(Continued)

FOREIGN PATENT DOCUMENTS

WO    WO-9858415    12/1998

(Continued)

OTHER PUBLICATIONS

U.S. Appl. No. 60/866,148, filed Nov. 16, 2006, Thieme et al.

(Continued)

*Primary Examiner*—Stanley Silverman
*Assistant Examiner*—Kallambella Vijayakumar
(74) *Attorney, Agent, or Firm*—Occhiuti Rohlicek & Tsao LLP

(57) ABSTRACT

Under one aspect, a method of making a superconductor wire includes providing an oxide superconductor layer overlaying a substrate; forming a substantially continuous barrier layer over the oxide superconductor layer, the barrier layer including metal; depositing a layer of metal particles over the barrier layer, said depositing including applying a liquid including metal particles over the barrier layer; and sintering the layer of metal particles to form a substantially continuous metal layer over the barrier layer. In one or more embodiments, the oxide superconductor layer is oxygen-deficient, and the method may include oxidizing the oxygen-deficient oxide superconductor layer. At least a portion of the sintering and the oxidizing may occur simultaneously, for example by performing them at an oxygen partial pressure and a temperature sufficient to both sinter the metal particles and to oxidize the oxygen-deficient oxide superconductor layer.

24 Claims, 9 Drawing Sheets

U.S. PATENT DOCUMENTS

| | | | |
|---|---|---|---|
| 5,147,851 A * | 9/1992 | Yamana et al. | 505/220 |
| 5,231,074 A | 7/1993 | Cima et al. | |
| 6,002,951 A * | 12/1999 | Goland et al. | 505/220 |
| 6,022,832 A | 2/2000 | Fritzemeier et al. | |
| 6,027,564 A | 2/2000 | Fritzemeier et al. | |
| 6,190,572 B1 | 2/2001 | Chen et al. | |
| 6,436,317 B1 | 8/2002 | Malozemoff et al. | |
| 6,537,689 B2 * | 3/2003 | Schoop et al. | 428/701 |
| 6,669,774 B1 * | 12/2003 | Zhang et al. | 117/4 |
| 6,745,059 B2 | 6/2004 | Buczek et al. | |
| 6,794,339 B2 * | 9/2004 | Wiesmann et al. | 505/470 |
| 6,797,313 B2 | 9/2004 | Fritzemeier et al. | |
| 6,893,732 B1 | 5/2005 | Fritzemeier et al. | |
| 6,974,501 B1 | 12/2005 | Zhang et al. | |
| 2004/0266628 A1 * | 12/2004 | Lee et al. | 505/238 |
| 2006/0040829 A1 | 2/2006 | Rupich et al. | |
| 2006/0040830 A1 | 2/2006 | Thieme et al. | |
| 2006/0073975 A1 * | 4/2006 | Thieme et al. | 505/125 |
| 2006/0073979 A1 | 4/2006 | Thieme et al. | |
| 2006/0094603 A1 | 5/2006 | Li et al. | |
| 2007/0179063 A1 * | 8/2007 | Malozemoff et al. | 505/329 |

FOREIGN PATENT DOCUMENTS

| | | |
|---|---|---|
| WO | WO-9916941 | 4/1999 |
| WO | WO-9917307 | 4/1999 |
| WO | WO-0058044 | 10/2000 |
| WO | WO-0058530 | 10/2000 |
| WO | WO-0108169 | 2/2001 |
| WO | WO-0108170 | 2/2001 |
| WO | WO-0108231 | 2/2001 |
| WO | WO-0108232 | 2/2001 |
| WO | WO-0108233 | 2/2001 |
| WO | WO-0108235 | 2/2001 |
| WO | WO-0108236 | 2/2001 |
| WO | WO-0111428 | 2/2001 |
| WO | WO-0115245 | 3/2001 |
| WO | WO-0126164 | 4/2001 |
| WO | WO-0126165 | 4/2001 |
| WO | WO-0235615 | 5/2002 |
| WO | WO-2005081710 | 9/2005 |
| WO | WO-2005121414 | 12/2005 |

OTHER PUBLICATIONS

U.S. Appl. No. 10/955,866, filed Sep. 29, 2004, Rupich et al.
U.S. Appl. No. 11/193,262, filed Jul. 29, 2005, Thieme et al.
U.S. Appl. No. 09/007,372, filed Jan. 15, 1998.
U.S. Appl. No. 09/500,701, filed Feb. 9, 2000.
U.S. Appl. No. 60/309,116, filed Jul. 31, 2001.
U.S. Appl. No. 11/394,917, filed Mar. 31, 2006, Thieme et al.
Shoup, S.S. et al., J. Am. Cer. Soc., vol. 81, 3019 (1998).
Beach, D. et al. Mat. Res. Soc. Symp. Proc., vol. 495, 263 (1988).
Paranthaman, M. et al. Superconductor Sci. Tech., vol. 12, 319 (1999).
Lee, D.J. et al. Japanese J. Appl. Phys., vol. 38 L178 (1999).
Rupich, M.W., et al., I.E.E.E. Trans. on Appl. Supercon. vol. 9, 1527 (1999).

\* cited by examiner

*Electrical Performance Versus Cure Time at Temperature in Air*

SYSTEMS AND METHODS FOR SOLUTION-BASED DEPOSITION OF METALLIC CAP LAYERS FOR HIGH TEMPERATURE SUPERCONDUCTOR WIRES

TECHNICAL FIELD

This invention generally relates to the field of manufacturing high temperature superconductors.

BACKGROUND

High temperature superconductor (HTS) materials provide a means for carrying extremely large amounts of current with extremely low loss. HTS materials lose all resistance to the flow of direct electrical current and nearly all resistance to the flow of alternating current when cooled below a critical temperature. The development of HTS wires (the expression "wires" is used here for a variety of conductors, including tape-like conductors) using these materials promises a new generation of high efficiency, compact, and environmentally friendly electrical equipment, which has the potential to revolutionize electric power grids, transportation, materials processing, and other industries. However, a commercially viable product has stringent engineering requirements, which has complicated the implementation of the technology in commercial applications.

In the second generation HTS wire (coated conductor) technology, currently under development, the HTS material is generally a polycrystalline rare-earth/alkaline-earth/copper oxide, e.g. yttrium-barium-copper oxide (YBCO). The current carrying capability of the HTS material is strongly related to its crystalline alignment or texture. Grain boundaries formed by the misalignment of neighboring crystalline superconductor grains are known to form an obstacle to superconducting current flow, but this obstacle decreases with the increasing degree of alignment or texture. Therefore to make the material into a commercially viable product, e.g. an HTS wire, the superconducting material must maintain a high degree of crystalline alignment or texture over relatively long distances. Otherwise, the superconducting current carrying capacity (critical current density) will be limited.

A schematic of a typical second-generation HTS wire 100 is shown in FIG. 1. The wire includes substrate 110, buffer layer 120 (which could include multiple buffer layers), superconductor layer 130, and cap layer 140, and is fabricated as described below. It should be noted that in this and all subsequent figures, the dimensions are not to scale. Superconductor materials can be fabricated with a high degree of crystallographic alignment or texture over large areas by growing a thin layer 130 of the material epitaxially on top of a flexible tape-shaped substrate 110 and buffer layer 120, which are fabricated so that the surface of the topmost layer has a high degree of crystallographic texture at its surface. When the crystalline superconductor material is grown epitaxially on this surface, its crystal alignment grows to match the texture of the substrate. In other words, the substrate texture provides a template for the epitaxial growth of the crystalline superconductor material. Further, the substrate provides structural integrity to the superconductor layer.

Substrate 110 and/or buffer 120 can be textured to provide a template that yields an epitaxial superconductor layer 130 with excellent superconducting properties such as high critical current density. Materials such as nickel, copper, silver, iron, silver alloys, nickel alloys, iron alloys, stainless steel alloys, and copper alloys can be used, among others, in the substrate. Substrate 110 can be textured using a deformation process, such as one involving rolling and recrystallization annealing the substrate. An example of such a process is the rolling-assisted biaxially textured substrate (RABiTS) process. In this case large quantities of metal can be processed economically by deformation processing and annealing and can achieve a high degree of texture.

One or more buffer layers 120 can be deposited or grown on the surface of substrate 110 with suitable crystallographic template on which to grow the superconductor layer 130. Buffer layers 120 also can provide the additional benefit of preventing diffusion over time of atoms from the substrate 110 into the crystalline lattice of the superconductor material 130 or of oxygen into the substrate material. This diffusion, or "poisoning," can disrupt the crystalline alignment and thereby degrade the electrical properties of the superconductor material. Buffer layers 120 also can provide enhanced adhesion between the substrate 110 and the superconductor layer 130. Moreover, the buffer layer(s) 120 can have a coefficient of thermal expansion that is well matched to that of the superconductor material. For implementation of the technology in commercial applications, where the wire may be subjected to stress, this feature is desirable because it can help prevent delamination of the superconductor layer from the substrate.

Alternatively, a non-textured substrate 110 such as Hastelloy can be used, and textured buffer layer 120 deposited by means such as the ion-beam-assisted deposition (IBAD) or inclined substrate deposition (ISD). Additional buffer layers 120 may be optionally deposited epitaxially on the IBAD or ISD layer to provide the final template for epitaxial deposition of an HTS layer 130.

By using a suitable combination of a substrate 110 and one or more buffer layers 120 as a template, superconductor layer 130 can be grown epitaxially with excellent crystal alignment or texture, also having good adhesion to the template surface, and with a sufficient barrier to poisoning by atoms from the substrate. The superconductor layer 130 can be deposited by any of a variety of methods, including the metal-organic deposition (MOD) process, metal-organic chemical vapor deposition (MOCVD), pulsed laser deposition (PLD), thermal or e-beam evaporation, or other appropriate methods.

A cap layer 140 can then be added to the multilayer assembly, which helps prevent contamination of the superconductor layer from above. The cap layer 140 can be, e.g., silver or a silver-gold alloy, and can be deposited onto the superconductor layer 130 by, e.g., sputtering. The cap renders the superconductor layer substantially impervious to contamination by environmental factors, which can degrade its electrical performance. The cap layer may also substantially prevent infiltration of the assemblies by surrounding cryogenic fluid, which can form balloons that can potentially mechanically damage the superconductor layer. Additionally, the cap layer also preferably "wets," or promotes adhesion to, filler material used in a later step to optionally bond the assembly to stabilizer strips.

A subsequent oxygenation step converts the as-deposited superconductor material to the superconducting phase. Metal "stabilizer" strips, such as copper or stainless steel layers, can subsequently be bonded to the cap layer and to the substrate, e.g., by soldering. Stabilizer strips are discussed below, and in the incorporated patent references.

An exemplary as-fabricated multilayer HTS wire 100 includes a biaxially textured substrate 110 of nickel with 5% tungsten alloy; sequentially deposited epitaxial buffer layers 120 of $Y_2O_3$, YSZ, and $CeO_2$; epitaxial layer 130 of YBCO; and a cap layer 140 of Ag. Exemplary thicknesses of these layers are: a substrate of about 25-75 microns, buffer layers of about 75 nm each, a YBCO layer of about 1 micron, and a cap layer of about 1-3 microns. HTS wires 100 as long as 100 m, and with widths of 10 cm or more, have been manufactured thus far using techniques such as those described above.

Although the formation of a cap layer by a physical vapor deposition process such as sputtering or evaporation is a well-understood process, its use can substantially increase the cost of producing HTS wires. Among other things, it can be relatively time intensive to sputter a sufficient thickness of metal to form a cap layer, e.g., 1-3 microns of silver. Thus, sputtering can slow wire production, and thus increase costs. It can also be relatively expensive to maintain a sufficient vacuum during the time required for sputtering. Moreover, sputtering is a relatively inefficient process. For example, typically approximately 30% of the source material consumed by the sputtering process may be deposited onto the superconductor layer and thus form the cap layer; while the remaining approximately 70% of the source material may be deposited on the inside of the vacuum chamber, or pulled into the vacuum itself. This inefficiency adds to the cost of performing the step, and, for more costly metals such as gold, may make the use of the process prohibitively expensive.

Heating during the physical vapor deposition of a cap layer can also have detrimental effects on the self-field and in-field performance of the superconductor, e.g., YBCO, thus necessitating active cooling of the wire during this step. This can add to the time and cost associated with producing the HTS wire, and presents a risk of degradation in the wire's performance.

SUMMARY

Embodiments of the present invention provide systems and methods for the solution-based deposition of metallic cap layers for high temperature superconductor wires.

Under one aspect, a method of making a superconductor wire includes providing an oxide superconductor layer overlaying a substrate; forming a substantially continuous barrier layer over the oxide superconductor layer, the barrier layer including metal; depositing a layer of metal particles over the barrier layer, said depositing including applying a liquid including metal particles over the barrier layer; and sintering the layer of metal particles to form a substantially continuous metal layer over the barrier layer.

One or more embodiments include one or more of the following features. The oxide superconductor layer is oxygen-deficient. Oxidizing the oxygen-deficient oxide superconductor layer. At least a portion of said sintering and said oxidizing occurs simultaneously. Performing said sintering and said oxidizing at an oxygen partial pressure and a temperature sufficient both to sinter the layer of metal particles and to oxidize the oxygen-deficient oxide superconductor layer. Forming the barrier layer with sufficient thickness so as to substantially prevent the liquid from contacting the oxide superconductor layer. The barrier layer is between about 10 nm and about 500 nm thick. Forming the barrier layer includes physical vapor deposition of the barrier layer. The physical vapor deposition includes one of sputtering or evaporation. The barrier layer includes a noble metal. The barrier layer includes silver. Depositing the liquid includes one of slot-die coating, dip coating, spray coating, Gravure printing, screen printing, ink-jet printing, and doctor-blading. Forming a substantially continuous metal layer on a lower surface of the substrate. The metal particles include metal nanoparticles. At least some of the nanoparticles have a diameter between about 10 nm and about 200 nm. A first portion of said metal particles has a first composition, and wherein a second portion of said metal particles has a second composition. Sintering the metal particles forms an alloy between the first composition and the second composition. The metal particles include at least one of silver, gold, copper, nickel, magnesium, palladium, platinum, cadmium, and mixtures thereof. The liquid includes at least one of water and an organic solvent. Laminating a stabilizer layer to the cap layer. The liquid includes at least one of a surfactant and a pH-adjusting agent. Providing at least one buffer layer interposed between the oxide superconductor layer and the upper surface of the substrate. Patterning the layer of metal particles.

Under another aspect, a method of making a high temperature superconductor wire includes: providing an oxide superconductor layer overlaying an upper surface of the substrate; forming a substantially continuous barrier layer over the intermediate superconductor layer, the barrier layer including metal; depositing a metalorganic composition over the barrier layer, said depositing including applying a liquid including a metalorganic compound dissolved in a solvent over the barrier layer; and sintering the deposited metalorganic composition to form a substantially continuous metal layer over the barrier layer. In some embodiments, the metalorganic compound includes at least one of silver acetylacetonate and silver nitrate.

Under another aspect, an intermediate structure formed during the manufacture of a high temperature superconductor wire includes: an oxide superconductor layer overlaying an upper surface of a substrate; a substantially continuous barrier layer overlaying the oxide superconductor layer, the barrier layer including metal; and a layer of metal particles overlaying the barrier layer.

The expression "HTS wire" is intended to indicate a multilayer structure for use in carrying current, which is substantially sealed to the environment. An HTS wire typically includes a substrate, one or more buffer layers, a superconductor filament, a cap layer, and optionally a stabilizer layer that can be considered part of the cap layer. Generally in this HTS wire, the superconductor layer can be electrically isolated from the metallic substrate by the buffer layer(s). However, if electrically conductive buffer layers are used, the superconductor layer can be electrically connected to the metal substrate. Alternatively, an electrically conductive cap layer can be in contact with both the superconductor layer and the substrate, and provide electrical contact between the two.

The expression "sealed" is intended to mean substantially surrounded and substantially physically isolated from the environment. The expression "sealed" may include, but is not required to include, substantial impermeability to penetration from gas or liquid under normal circumstances.

BRIEF DESCRIPTION OF THE DRAWINGS

The invention is described with reference to the following figures, which are presented for the purpose of illustration only and which are not intended to be limiting of the invention.

DETAILED DESCRIPTION

Overview

Figure 1:
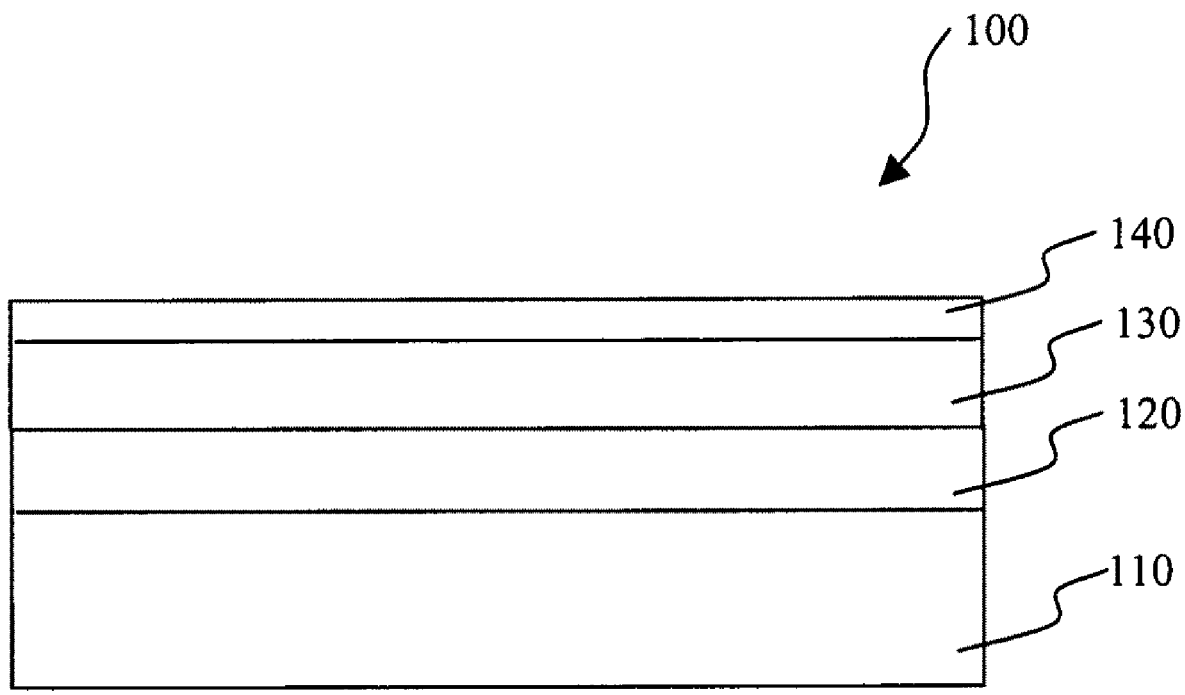
FIG. 1 is a cross-sectional view of a typical HTS wire.

Embodiments of the present invention provide systems and methods for the solution-based deposition of metallic cap layers for high temperature superconductor wires.

As mentioned above, metallic cap layers are conventionally formed over oxide superconductor layers by physical vapor deposition processes, e.g., by sputtering silver or other suitable metal onto the superconductor layer, which tends to be inefficient and time consuming, thus increasing the cost of producing HTS wires. An alternative approach, discussed herein, uses systems and methods for the solution-based deposition of metallic cap layers over oxide superconductor layers. Some embodiments of these systems and methods provide a highly efficient use of material, improve deposition time over conventional physical vapor deposition processes, and can be readily integrated with existing systems and methods for producing the other components of HTS wires. Thus, some embodiments of these systems and methods can reduce the time and expense that would be needed to produce HTS wires using the conventional physical vapor deposition of cap layers.

Specifically, in some embodiments, a metallic cap layer is formed by depositing a metal-containing liquid or solution, or "metal ink," over an HTS assembly during an appropriate intermediate stage of manufacture, e.g., an HTS assembly onto which a cap layer would otherwise be deposited using conventional methods. In some embodiments, the metal ink is deposited directly onto the HTS layer, while in other embodiments, the metal ink is deposited onto a layer overlaying the HTS layer, but provides electrical contact between the HTS layer and the deposited ink. The metal ink contains metal particles, such as nanoparticles having a diameter of about 200 nm or less, dispersed in an appropriate solvent. The particle size and concentration in the solution is selected according to the intended use of the finished HTS wire, and other components may be included in the solution to improve dispersion of the particles in the solvent. For example, particle aggregation and dispersion can be controlled by adding selected surfactants and/or varying the pH of the solution. Various suitable systems and methods can be used to deposit the ink onto the intermediate HTS assembly, e.g., dip coating, slot die coating, or ink jet coating, as described in greater detail below. The ink thus deposited on the HTS assembly is then dried, i.e., the solvent is substantially removed, to form a "precursor cap layer" of metal particles. The precursor cap layer is then sintered and densified, e.g., by heating it to a sufficient temperature to melt the metal particles, fusing the particles to each other and forming a substantially continuous cap layer. While the appropriate sintering temperature depends on the particle size and composition, in some embodiments a sintering temperature between about 200° C. and about 600° C. is sufficient to sinter the particles to form a cap layer. Temperatures higher than the minimum sufficient sintering temperature will also satisfactorily sinter the particles. In some embodiments, the resulting cap layer has an electrical resistance and/or density that is comparable to a cap layer of similar dimension formed by a conventional physical vapor deposition process.

In some embodiments, the HTS assembly including the solution-deposited precursor cap layer includes an intermediate superconductor layer, e.g., an oxygen-deficient oxide superconductor layer that requires an oxidation step in order to be converted to a finished oxide superconductor. For example, a tetragonal YBCO composition such as $YBa_2Cu_3O_{6.5}$ requires oxygenation for conversion to the oxide superconductor $YBa_2Cu_3O_{7-x}$. In some embodiments, the sintering of the precursor cap layer and the oxidation of the intermediate superconducting layer is combined into a single process, further improving the efficiency and speed of producing the finished HTS wire. Specifically, the sintering and oxidation steps can be performed in a combination sinter/oxidation chamber that has an atmosphere and a temperature suitable for both sintering the precursor cap layer and oxidizing the intermediate superconductor, thus allowing both processes to be performed "simultaneously," e.g., an oxygen atmosphere at 1 atm pressure and a temperature between about 500° C. and about 700° C., depending on the minimum temperature needed to satisfactorily sinter the particles and also oxidize the intermediate superconductor layer. By "simultaneously" it is meant that the same process conditions, e.g., the chamber, atmospheric composition and pressure, and temperature, achieve both sintering and oxidation. In other words, separate steps, equipment, or process conditions need not be used to accomplish the two processes. Note, however, that the two processes do not necessarily completely, or even partially, overlap in time. When the intermediate HTS assembly (including the precursor cap layer and the intermediate superconductor layer) is introduced to the sinter/oxidation chamber, the assembly generally does not heat instantaneously to the temperature of the chamber. Instead, the assembly gradually warms to the target chamber temperature from its previous temperature. As the assembly's temperature changes over time, the sintering and oxidation steps may initiate and/or finish over different time and temperature ranges. For example, the metal particles in the precursor cap layer may begin sintering when the assembly reaches a temperature that is insufficient for the intermediate superconductor layer to begin oxidizing. Then, as the assembly continues to warm up, when the intermediate superconductor layer begins oxidizing at an appropriate temperature, the sintering process may have already completed, or may continue during part or all of the oxidation process.

In other embodiments, the metal ink can be deposited over a finished oxidized superconductor layer, e.g., one that is not oxygen-deficient, and the resulting assembly is subsequently sintered without needing to perform simultaneous oxidation. Although subsequent discussions mostly refer to embodiments in which the metal ink is deposited over an intermediate, oxygen-deficient oxide superconductor layer, it should be understood that those of ordinary skill in the art would be able to readily adapt the described processes for embodiments in which the metal ink is instead deposited over a finished oxide superconductor layer.

In some embodiments, a thin barrier layer is deposited over the intermediate superconductor layer, before applying the metal ink. The thin barrier layer can provide a barrier between the ink and the superconductor layer and inhibit potential contamination of the intermediate superconductor layer by the ink. For example, the thin barrier layer provides a physical and chemical barrier to modification of the surface of the intermediate superconductor layer by solvent in the ink. The thin barrier layer can also provide a lower contact resistance between the cap layer and the superconductor layer in the completed HTS wire than may be available if the ink directly contacted and thus changed the surface properties of the intermediate superconductor layer. The thin barrier layer can also provide a reactive surface for the subsequent sintering of the metal particles in the precursor cap layer, e.g., the metal particles in the precursor cap layer may sinter more efficiently over the metallic thin barrier layer than they would over an intermediate superconductor layer. In some embodiments, the thin barrier layer is substantially continuous, having a sufficient thickness to form a substantially continuous barrier between the metal ink and the underlying intermediate superconductor layer, e.g., having a thickness between about 10 nm and about 1 μm. The thin barrier layer may be deposited using conventional vapor deposition methods such as sputtering. Although it was noted above that the conventional vapor deposition of a full cap layer, e.g., 1-3 μm of silver, can be inefficient and time consuming, a thin barrier layer is generally significantly thinner than a cap layer, and so the loss of source material and the amount of time needed to deposit it are reduced accordingly. Preferably, the thin barrier layer is kept as thin as possible to ensure efficient use of material, while still providing a sufficient barrier between the underlying intermediate superconductor and the metal ink. The relatively thick precursor cap layer may then be deposited over the thin barrier layer using solution deposition, which is rapid and highly efficient, as discussed above. Note, however, that in other embodiments, the metal ink may be deposited directly onto the intermediate superconductor layer. Preferably, the formulation of the ink, e.g., the particle composition and size, the solvent composition, and any other relevant parameters, is selected so as to minimize potential contamination of the intermediate superconductor layer.

It may be desirable to additionally solution-deposit (or otherwise deposit) a metallic cap layer on the back of the substrate, i.e., on the side of the substrate opposite the superconductor layer. For example, as described in U.S. patent application Ser. No. 11/193,262, the back of a substrate typically does not sufficiently "wet" or adhere to solder to allow the back of the substrate to be laminated with solder to another structure such as a stabilizer strip. However, the addition of a cap layer to the back of the substrate can provide a surface that sufficiently wets solder to allow the substrate to then be laminated with solder to the desired structure. Cap layers can be solution-deposited on the backs of substrates using substantially the same methods as described herein, e.g., by depositing a metal ink over the back side of the substrate, drying the ink to form a precursor cap layer, and sintering the precursor cap layer to form a substantially continuous cap layer. This deposition can be performed simultaneously with the deposition of the metal ink over the intermediate superconductor layer, e.g., by dipping the intermediate HTS assembly into the solution, or it can be performed in a separate step.

In some embodiments, the buffer layer(s), intermediate superconductor layer, and precursor cap layer are formed over substantially the entire width of the substrate. In other embodiments, the buffer layer(s), superconductor precursor layer, and/or precursor cap layer are patterned, as discussed in greater detail below. In still other embodiments, a highly resistive layer is deposited over patterned buffer and superconductor layers, and a non-patterned precursor cap layer is deposited over the highly resistive layer.

Figure 2:
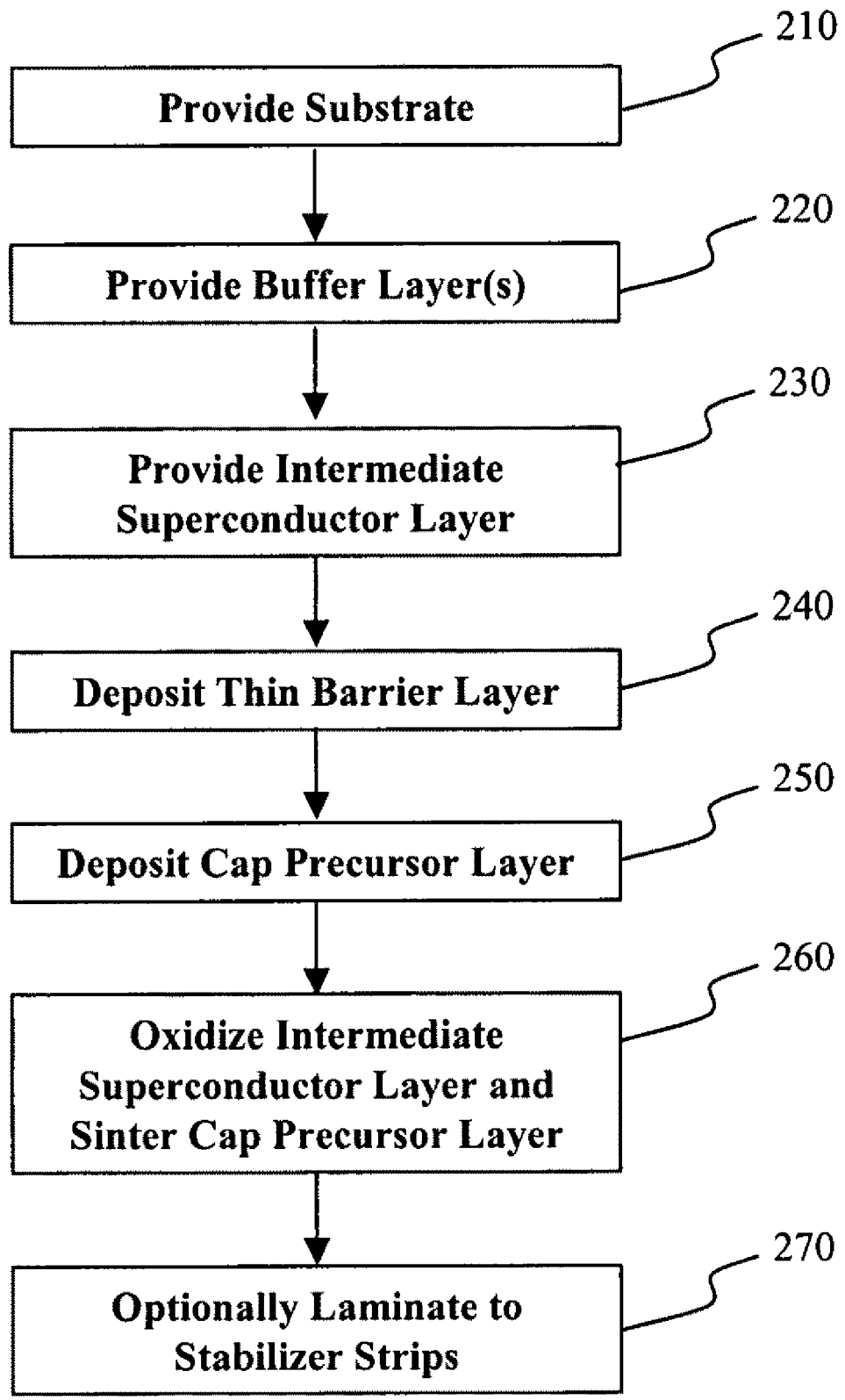
FIG. 2 is a flow chart of steps in the fabrication of HTS wires according to one or more embodiments of the invention.

FIG. 2 is a high level overview of steps in the fabrication of HTS wires according to certain embodiments. First, a substrate is provided (210). Then, one or more buffer layers are provided over a surface of the substrate (220). Then, an intermediate superconductor layer is provided over the one or more buffer layers (230). Then, a thin barrier layer is optionally deposited over the intermediate superconductor layer (240). Then, a cap precursor layer is deposited over the thin barrier layer, e.g., by depositing a metal "ink" containing metal particles and a solvent, and then drying the solvent (250). Then, the intermediate superconductor layer is oxidized simultaneously with sintering of the cap precursor layer, thus forming finished superconductor layer and cap layers (260). Then, optionally stabilizer strips are laminated to the cap layer, using a filler such as solder (270). This forms an HTS wire that is substantially sealed to the environment, and optionally includes stabilizer strips for additional thermal, mechanical, and electrical stability.

Various embodiments of steps and systems used in the manufacture of HTS wires having solution-deposited metallic cap layers are described in greater detail below. FIGS. 3A-3F are cross-sectional illustrations of beginning, intermediate, and final structures formed during the fabrication of HTS wires according to certain embodiments.

1. Substrate and Buffer Layer(s)

Figure 3A:
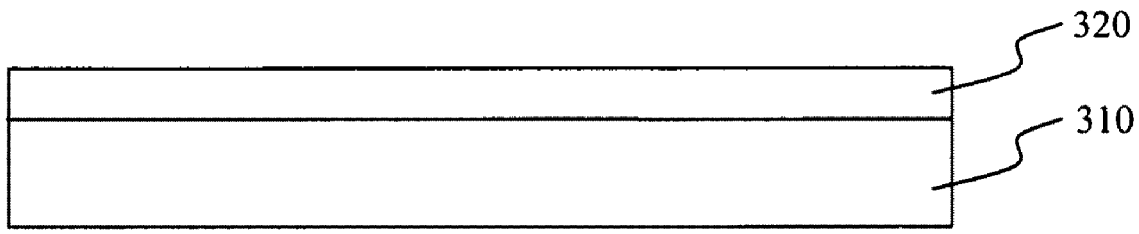
FIGS. 3A-3F are cross-sectional views of structures formed during the manufacture of HTS wires according to one or more embodiments of the invention.

First, as shown in FIG. 3A, a substrate 310 is provided. As described in greater detail below, the substrate can be a metal such as nickel, copper, silver, copper, zinc, aluminum, chromium, vanadium, palladium, molybdenum, and/or their alloys, e.g., nickel-tungsten. In one embodiment, a surface of substrate 310 is biaxially textured to provide a crystal template for buffer layer(s) 320 and superconductor layer 330. One or more buffer layer(s) 320 are deposited on substrate 310. In one or more embodiments, the buffer layer is an electrically insulating material, although electrically conductive materials can also be used. The buffer layer is made up of, e.g., an inert metal, an oxide, zirconate, titanate, niobate, nitride, tantalate, aluminate, cuprate, manganate, or ruthenate of a metal or rare earth element (e.g. $Al_2O_3$, $CeO_2$, $Y_2O_3$, MgO, $Gd_2O_3$, strontium titanate, gadolinium zirconate, yttria-stabilized zirconia, AlN, $Si_3N_4$, $LaMnO_4$, $La_2Zr_2O_7$, or $La_{2-x}Ce_xZr_2O_7$). Any material, or combination of materials, that provides a suitable texture on which to grow a superconductor crystal can be used.

2. Superconductor Intermediate Layer

Figure 3B:
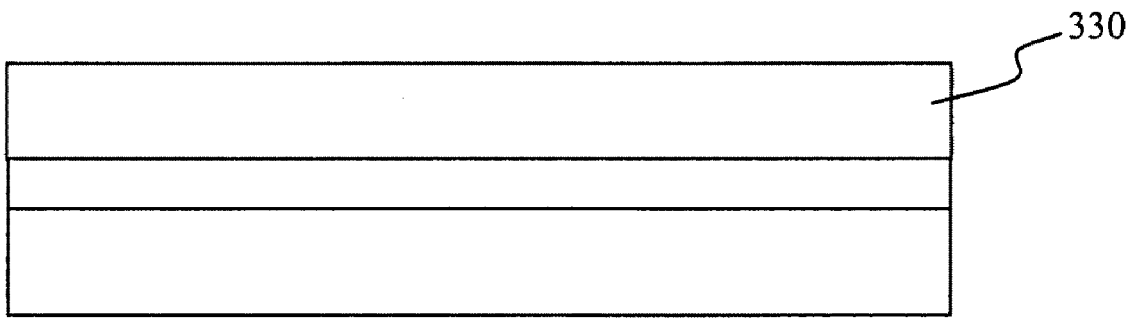

Next, as shown in FIG. 3B, intermediate superconductor layer 330 is formed over buffer layer(s) 320. Intermediate superconductor layer 330 may be formed by depositing a precursor superconductor material on buffer layer(s) 320 and then converting that precursor to an intermediate superconductor material, as described in greater detail below, and as is generally known in the art. In some embodiments, the intermediate superconductor layer 330 includes intermediate elements to a rare earth-alkaline earth-copper oxide, such as YBCO, although in general intermediate elements to any high temperature superconductor can be used.

3. Thin Barrier Layer

Figure 3C:
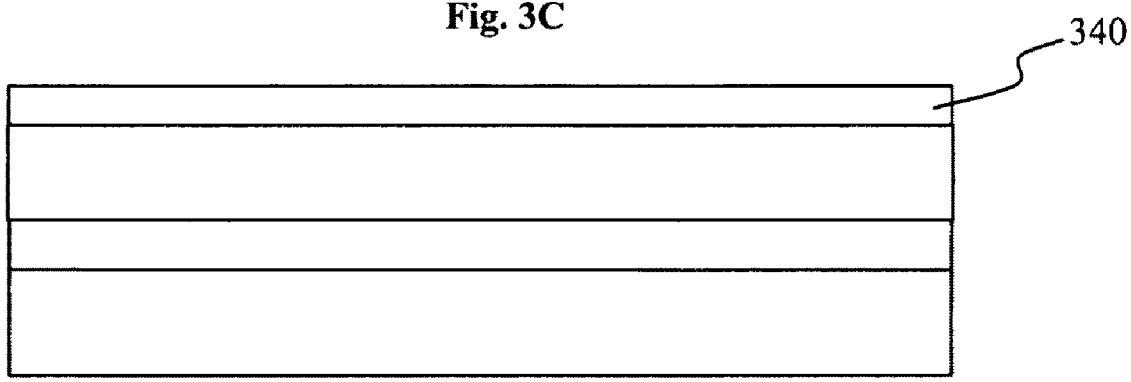

Next, as shown in FIG. 3C, the superconductor intermediate layer 330 is optionally coated with a thin barrier layer 340. In some embodiments, the thin barrier layer 340 is a noble metal, such as silver or gold, or another suitable material that is substantially inert to the superconductor intermediate layer. Thin barrier layer 340 is sufficiently thick to form a substantially continuous layer over the intermediate superconductor layer, and thus substantially prevent the metal ink from contaminating the intermediate superconductor layer during subsequent steps. The sufficient thickness for thin barrier layer 340 is related to the surface roughness of the intermediate superconductor layer 330, e.g., the number and depth of pores in the surface of the intermediate superconductor layer. For example, if the intermediate superconductor layer 330 is relatively smooth, the thin barrier layer 340 may need to be a few nm in thickness, e.g., between about 10 nm and about 100 nm, in order to form a substantially impermeable barrier between the intermediate superconductor layer 330 and the subsequently deposited metal ink. Or, for example, if the intermediate superconductor layer 330 is relatively rough, e.g., is relatively porous, a thin barrier layer 340 that is somewhat thicker, e.g., between about 100 nm and about 1 µm, may be needed in order to form a substantially impermeable barrier between the intermediate superconductor layer and the subsequently deposited metal ink.

As mentioned previously, the thin barrier layer 340 may be deposited onto the intermediate HTS assembly 310, 320, 330, e.g., using a physical vapor deposition process such as sputtering or evaporation, which are well understood techniques. For example, deposition of metals such as Ag by DC sputtering is a standard operation. The thin barrier layer 340 may be deposited onto intermediate HTS assembly 310, 320, 330 by continuously pulling the assembly through a plasma in the sputtering chamber. In order to avoid possible degradation of the superconductor layer's properties, the assembly is cooled as it passes through the chamber by pulling it across a cooling block positioned opposite the Ag target, to keep the assembly's layer below, e.g., about 200° C. Energy imparted from the plasma likely cleans the deposition surface in situ, and deposits the Ag ions with enough impact energy to make good physical contact.

The thin barrier layer 340 can also be deposited by an electroplating process, or by an electroless plating process, all of which are well known. Cu, Ag, Ti, TiN, and Sn are examples of metals that can be deposited onto superconductor and buffer filaments with these methods. Other materials, or combinations of materials, can also be used as the thin barrier layer.

4. Precursor Cap Layer

Figure 3D:
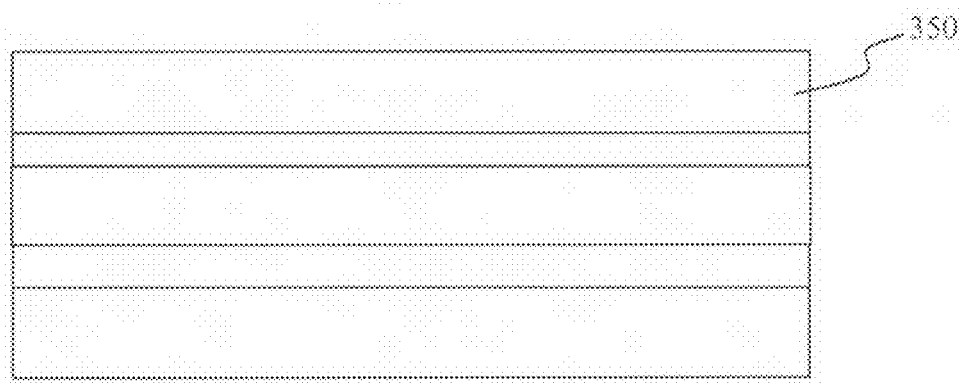

Next, as shown in FIG. 3D, a metal ink is solution-deposited over thin barrier layer 340 to form cap precursor layer 350. The metal ink contains a dispersion of metal particles suspended in an appropriate solvent. Preferably, the metal particles are "nanoparticles," having submicron diameters, e.g., between about 10 nm and 1000 nm, or between about 10 nm and about 200 nm, or between about 10 nm and about 100 nm. The particles need not be identically sized, but in some embodiments will be about the same size, e.g., substantially all of the particles will be within about 20%, or even about 10%, of the size selected for the particular application. In other embodiments, the particles may have a wide distribution of sizes; for example, some suitable commercial solutions include a distribution of particle sizes in the range of 10 nm to 200 nm. The use of metal nanoparticles typically allows the cap layer formed during the subsequent sintering step (described in greater detail below) to be denser and more continuous than a cap layer of comparable dimension formed using larger metal particles. Thus, metal nanoparticles can potentially form cap layers that are substantially continuous and are significantly thinner than typically achievable with larger metal particles. Additionally, metal nanoparticles, particularly those smaller than about 100 nm, tend to be easier to keep suspended in the solvent than larger particles, thus making their handling and deposition simpler.

The solvent in the metal ink may be selected to be compatible with the selected deposition method, e.g., dip coating, slot die coating, or ink jet coating. Some deposition methods are not materially affected by the type of solvent used, while the success of other deposition methods may more strongly relate with the type of solvent used. The solvent in the metal ink may also be selected so as to be compatible with the assembly onto which it is deposited. For example, if the metal ink is deposited directly onto the intermediate superconductor layer, i.e., if no thin barrier layer is included in the fabrication, then the solvent preferably does not substantially permeate or contaminate the intermediate superconductor layer and thus does not cause a degradation in performance of the finished superconductor layer. Selection of an appropriate metal ink thus depends upon the particular fabrication scheme. For example, if a thin barrier layer is not provided to isolate the intermediate superconductor layer, an non acidic aqueous-based metal ink can be used, since aqueous solvents tend to be relatively compatible with intermediate superconductor layers. However, at the same time, certain metal particles tend to agglomerate more easily in aqueous solvents than in organic solvents, making an aqueous-based metal ink more suitable for use with, e.g., dip coating or slot-die coating methods, but less suitable for use with an ink-jet printer, in which the agglomerated particles could potentially clog an ink-jet nozzle. Other appropriate solvents include ethanol, ethylene glycol, terpineol, and mixtures thereof.

In some circumstances, suitable metal inks can be commercially purchased. For example, "nano-silver inks" are currently being developed for "printable electronics" applications such as RFID tags and flexible electronics. In "printable electronics" applications, such "nano-silver inks" can be deposited in patterns by printing processes such as gravure printing, offset printing, and inkjet printing. Different formulations of "nano-silver inks" can be purchased for a variety of applications and printing techniques. However, some commercially available metal inks are not compatible with intermediate superconductor layers, thus making it preferable to include a thin barrier layer over the intermediate superconductor layer. More specifically, solvents in certain ink formulations tend to wick into and thus degrade the surface of the intermediate superconductor layer, leading to a poorly bonded, high-resistance interface between the superconductor layer and the cap layer in the finished HTS wire. This poor bonding can also cause mechanical weakness, e.g., delamination of the cap layer from the superconductor layer under certain circumstances. Including a thin barrier layer over the intermediate superconductor layer can diminish or eliminate these effects by forming a barrier between the intermediate superconductor layer and the deposited ink, and thus provide more flexibility in choice of inks and solvents. One commercially available ink is AG-IJ-G-100-S1, made by Cabot Corporation, which includes approximately 15-40 wt. % ethanol, 10-30 wt. % Ag nanoparticles, and 15-40 wt. % ethylene glycol). The ink includes a distribution of particle sizes between about 10 nm and 200 nm, with most particles in the 30-50 nm range.

Note that the metal ink optionally also contains surfactants or other compounds that, e.g., facilitate the suspension of the metal particles in the solvent or the spread of the metal ink on a surface, or otherwise improve the deposition of the ink via the system or method used for deposition. These surfactants or other compounds may substantially evaporate when the ink is dried, or may decompose during the annealing process. Commercially available metal inks tend to include a variety of proprietary compounds in addition to the metal particles and solvent(s), however it is not believed that the presence of these compounds detrimentally affects the formation of a substantially continuous cap layer when sintering the deposited metal ink.

The desired thickness to which the metal ink is deposited depends on the intended use of the wire, and the desired resistivity of the finished cap layer. For example, cap layer thicknesses between about 0.5 μm and about 4 μm are suitable for many intended uses of the wire. Note that in embodiments in which the finished cap layer is subsequently be laminated with solder to another structure, such as a stabilizer strip, some of the cap layer will dissolve into the solder. Thus, the metal ink is deposited to a sufficient thickness, e.g., between about 1 μm and about 4 μm, so as to not entirely dissolve into the solder. The appropriate minimum depends, among other things, on the composition and temperature of the solder, and the amount of time the finished cap layer is immersed in the solder.

The desired composition of the metal ink, e.g., the metal particles used in the ink, also depends on the intended use of the finished wire, and the desired resistivity of the finished cap layer. In some embodiments, the ink includes metal particles of a single kind, e.g. metal particles made of silver, gold, or other noble metal. In other embodiments, the ink includes a mixture of kinds of metal particles, and the composition and relative proportion of metal particles in the mixture is selected to provide a desired resistivity of the finished cap layer. Conventionally, the resistivity of a cap layer is typically "adjusted" by mixing two or more metals which form an alloy with a higher resistivity. In contrast, the use of metal particles of different types allows the resistivity of the finished cap layer to be readily "tuned" for a specific application by changing the composition and proportion of the metal particles in the metal ink. For example, in fault-limiter applications, having a cap layer of a relatively high resistivity over the superconductor layer is desirable. A cap layer of suitable resistivity for such an application can be formed, e.g., by depositing a metal ink having a relative particle composition of about 97-98% silver particles and about 2-3% gold particles. Sintering the deposited ink forms an alloy of substantially the same composition. The particles used in the metal ink may also be alloys. For further details on desirable alloys and resistivities for various HTS wire applications, see, e.g., U.S. Provisional Patent Application No. 60/866,148, the entire contents of which are incorporated herein by reference. For example, an Ag—Au alloy with Au content of 5-10% wt is widely used as low electrical and thermal conductivity sheath material of HTS wires, and can have a conductivity of less than 50% that of pure Ag, for example less than 40%. Other useful alloys include Ag—Au alloy with Au content of between about 1-5%, or between about 2.5-5%.

Note that while the described embodiments are mostly directed to metal inks containing metal particles, in other embodiments, the metal inks instead contain a solubilized metal complex that can subsequently be converted to a metal layer, e.g., through a chemical reaction. For example, some metalorganic compounds such as silver acetylacetonate or silver nitrate can be converted to a metal layer upon heating. Upon heating to approximately 200° C., the metalorganic compound decomposes, releasing gases and forming a metal layer of residual metal particles. Upon heating to greater than about 350° C., or in some embodiments greater than 400° C., the residual metal particles sinter to form a substantially continuous metal layer that adheres to the thin barrier layer.

As mentioned above, the metal ink can also be deposited on the back of the substrate to provide a surface that readily wets solder, and thus facilitates lamination of the substrate to another structure, such as a stabilizer strip. Typically, a thin barrier layer need not be included on the back of the substrate, since the substrate's chemical characteristics, mechanical characteristics, and susceptibility to contamination are significantly different than those of the superconductor layer. However, inclusion of a thin barrier layer on the back of the substrate, before depositing the metal ink, may be desirable under some circumstances and/or desired uses.

During or after deposition on the intermediate HTS assembly, the layer of metal ink is dried to substantially remove the solvent. For example, the assembly with deposited metal ink may be continuously fed through a heating chamber that is heated to a temperature sufficient to dry the solvent. The appropriate temperature will depend, among other things, on the boiling point of the solvent in the ink. The drying step can also be incorporated into the sinter/oxidation step. For example, the solvent may be dried by ramping the assembly temperature as it enters a sinter/oxidation chamber, or by simply heating the assembly within the sinter/oxidation chamber.

Some exemplary methods for solution-depositing metal inks onto intermediate HTS assemblies, e.g., onto intermediate superconductor layers, thin barrier layers, and/or backs of substrates, are described below. Those skilled in the art will readily appreciate that many other methods can be used to solution-deposit metal inks, e.g., spraying, roll printing, or laser-printing.

A. Ink Jet Coating

Inkjet-type printing methods can be used to deposit a metal ink onto an intermediate HTS assembly. In one embodiment, a metal ink is introduced to a dispensing device that has at least one nozzle through which the ink may be discharged, continuously and/or intermittently on demand, in the form of discrete fine droplets. The dispensed ink is deposited onto the intermediate HTS assembly. In some embodiments, the ink is deposited over substantially the entire width of the assembly, thus forming a precursor cap layer over substantially the entire width of the assembly. In other embodiments, the ink is deposited in a predetermined pattern, and thus forms a precursor cap layer in a predetermined pattern.

A wide range of dispensing devices can be used to dispense the metal ink. A dispensing device may include, for example, an inkjet print head (capable of, e.g., continuous and/or drop-on-demand printing), liquid droplet generator, extrusion device, gear pump, air pressure pump, positive displacement pump, screw-driven pump, syringe pump, fused deposition modeling nozzle or a combination thereof. These devices are well known in the art of liquid dispensing. If a patterned precursor cap layer is desired, the patterning can be precisely controlled using computer control, as is known in the art.

Figure 4:
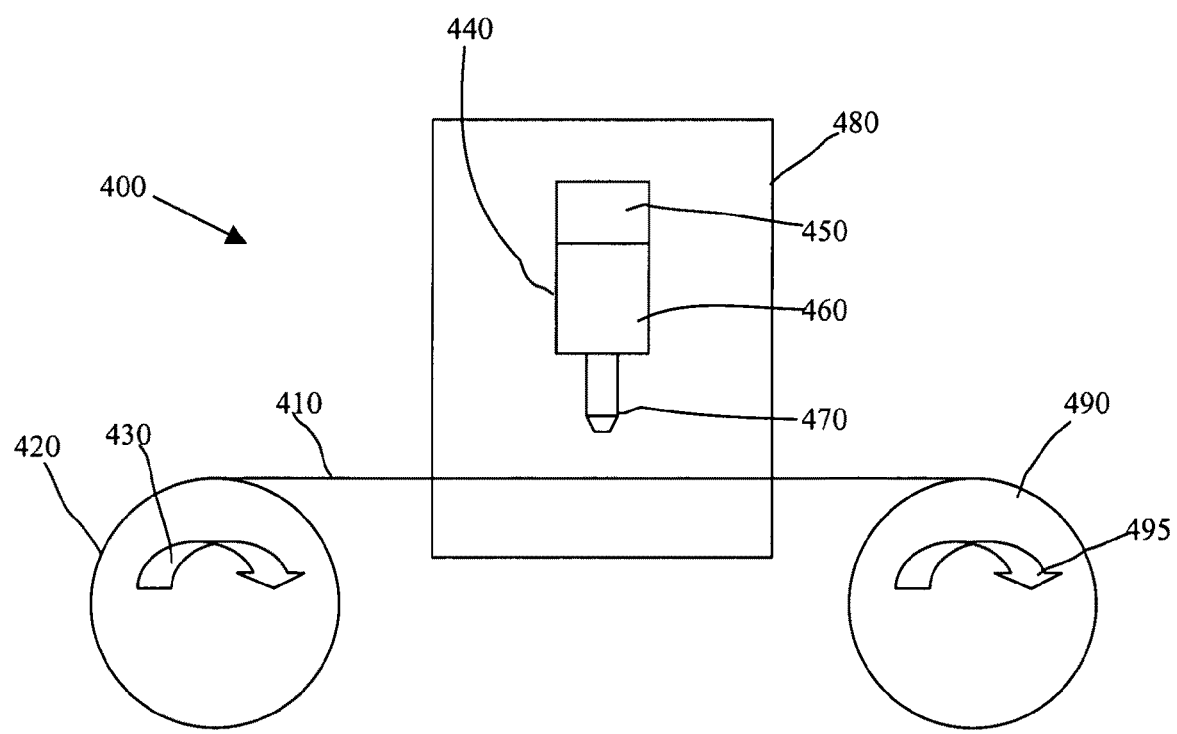
FIG. 4 shows a system used to solution deposit a cap precursor layer according to one or more embodiments of the invention.

FIG. 4 is a schematic illustration of a deposition system 400 that can be used to dropwise deposit a metal ink over an intermediate HTS assembly 410, e.g., the assembly illustrated in FIG. 3C, including substrate 310, buffer layer 320, intermediate superconductor layer 330, and thin barrier layer 340. The intermediate HTS assembly 410 is typically provided as long lengths wound on a mandrel 420 or appropriate storage base. The mandrel is driven, as indicated by arrow 430, continuously or intermittently, to advance the assembly to various locations with the deposition system. The assembly can be wound on a reel and transferred to a second reel such that during the transfer process the assembly 410 passes under the printer head. The system also includes a dropwise dispensing device 440, such as an inkjet printhead. The dispensing device 440 includes a reservoir 450 where the metal ink is housed and a dispensing head 460 for generating droplets of the metal ink. The dispensing head 460 further includes a nozzle or orifice 470 for ejecting droplets for deposition onto a receiving surface of the assembly. During the dispensing process, the assembly is moved past the dispensing head; the dispensing head may also be capable of movement.

In one configuration, the printer head includes multiple nozzles that extend across the width of the assembly that dispense the metal ink across the full width of the assembly, or in a pattern if so desired, as it is moved under the printer head. For example, inkjet printheads containing several hundred to several thousand discharge orifices are commercially available. An exemplary printhead provides ~22 µm×~5.3 µm sized dots and has a resolution of 1200×1200 dpi and 4800× 1200 dpi for conventional black and white and color printing, respectively. Alternatively, the dispensing device may include a plurality of dispensing heads, each having one or more discharge orifices. In another configuration, the printer head consists of one or more nozzles that extend across a fraction of the assembly width. In this configuration, the printer head is moved across the assembly in a coordinated movement with linear assembly movement to generate the desired pattern across the full width and along the length of the assembly. In another configuration, the assembly is attached to a movable support that is moved under the printer head to generate a pattern, if so desired.

The dispensing device may be contained within an enclosed environment 480, or it may be further equipped with fans or other means for controlling the vapor pressure above the deposited layer to assist in the drying of the metal ink (not shown). If the metal ink is dried to form a precursor cap layer, the resulting assembly may then be taken-up by a take-up mandrel 490 (driven as indicated by arrow 495), where it is stored until subsequent processing, e.g., sintering of the precursor cap layer and oxidation of the intermediate superconductor layer. Alternatively, the assembly can be advanced into a sinter/oxidation chamber for sintering of the metal particles into a substantially continuous cap layer and conversion of the intermediate superconductor layer into a finished superconductor layer.

For further details on inkjet-type systems and methods that are compatible with superconductor fabrication, see U.S. patent application Ser. No. 10/955,866, entitled "Dropwise Deposition of a Patterned Oxide Superconductor," the entire contents of which are incorporated herein by reference.

B. Slot Die Coating

Figure 5:
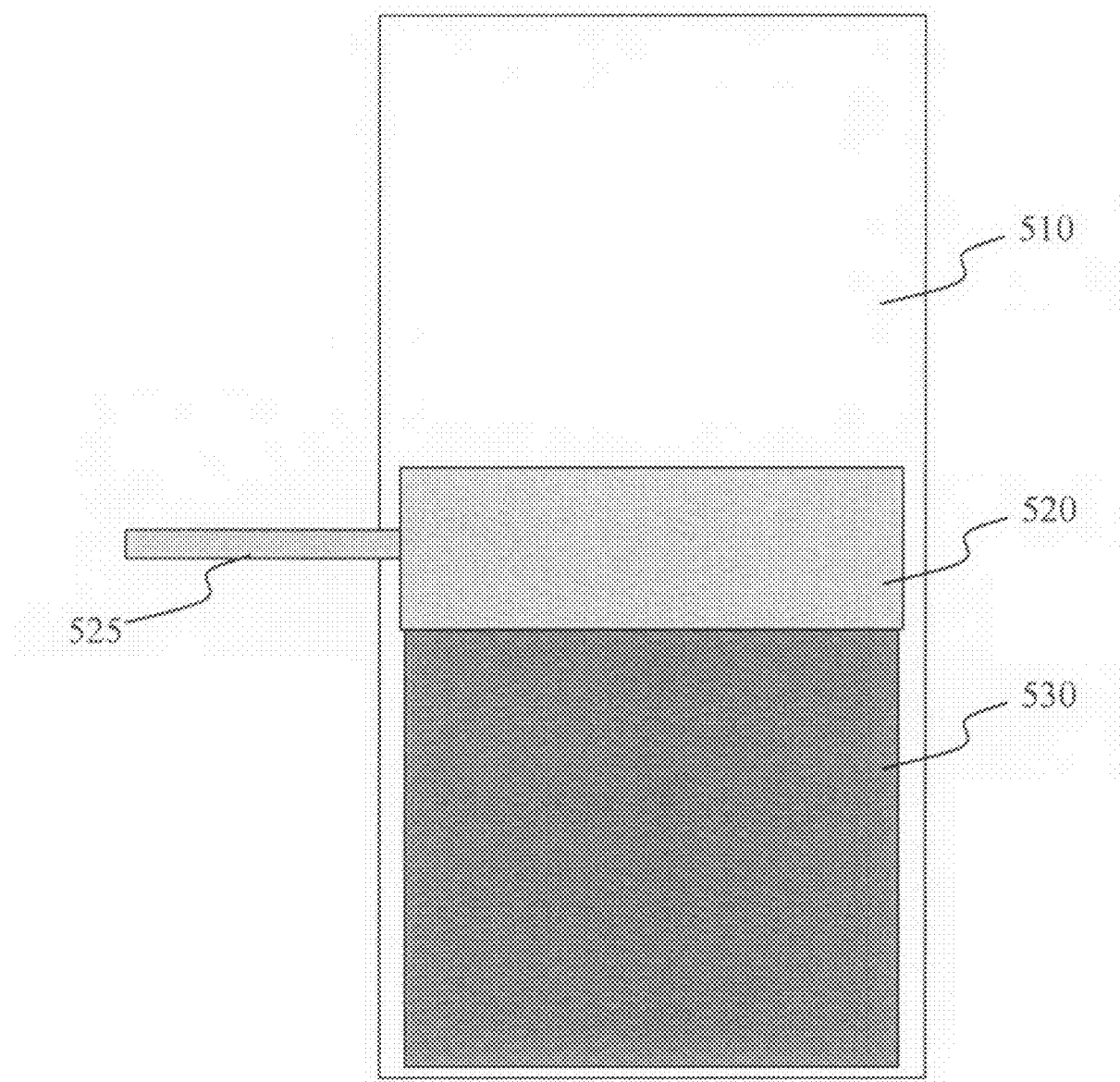
FIG. 5 shows a system used to solution deposit a cap precursor layer according to one or more embodiments of the invention.

Metal inks for forming metallic cap layers can also be solution deposited using slot die coating techniques, which are known in the art, and as are illustrated in FIG. 5. Here, a metal ink from a liquid feed 525 is pushed into a slot die head 520, through a slot in the slot die head 520, and onto a moving intermediate HTS assembly 510, which may be substantially the same as the assembly 410 described above relative to FIG. 4. The slot produces a band of metal ink 530 that is deposited onto the moving assembly 510. The ink is then dried separately or in combination with the sinter/oxidation step, thus resulting in a precursor cap layer of defined width. Optionally, if patterning of the metal ink is desired, the slot die head 520 includes a plurality of slots that dispense the ink in accordance with a predefined pattern.

C. Dip Coating

Metal inks for forming metallic cap layers can also be solution deposited using dip coating techniques, which are known in the art. Briefly, an intermediate HTS assembly, which may be substantially the same as the assembly 410 described above relative to FIG. 4, is immersed into a reservoir filled with metal ink for a pre-determined amount of time, and then removed from the reservoir. The ink coats the intermediate HTS assembly to a pre-determined thickness. The ink is then dried separately or in combination with the sinter/oxidation step, thus resulting in a precursor cap layer. Optionally, the intermediate HTS assembly is continuously fed through the reservoir at a velocity and for a length that immerses a given region of the assembly for the appropriate amount of time.

5. Sinter/Oxidization

Figure 3E:
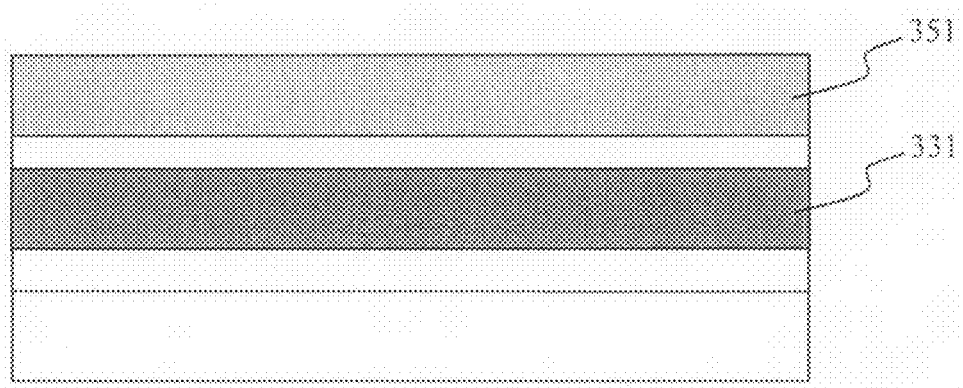

Next, as shown in FIG. 3E, the intermediate HTS assembly, including intermediate superconductor layer 330 and precursor cap layer 340, is simultaneously oxidized to form finished superconductor layer 331 and sintered to form finished cap layer 341. These processes can be performed within a combination sinter/oxidation chamber, as discussed below, without the need for separate process steps or equipment to achieve both sintering and oxidation. Note that the drying step to remove the solvent from the deposited metal ink and thus form precursor cap layer 340 may also be integrated into this process, as discussed above.

Figure 6:
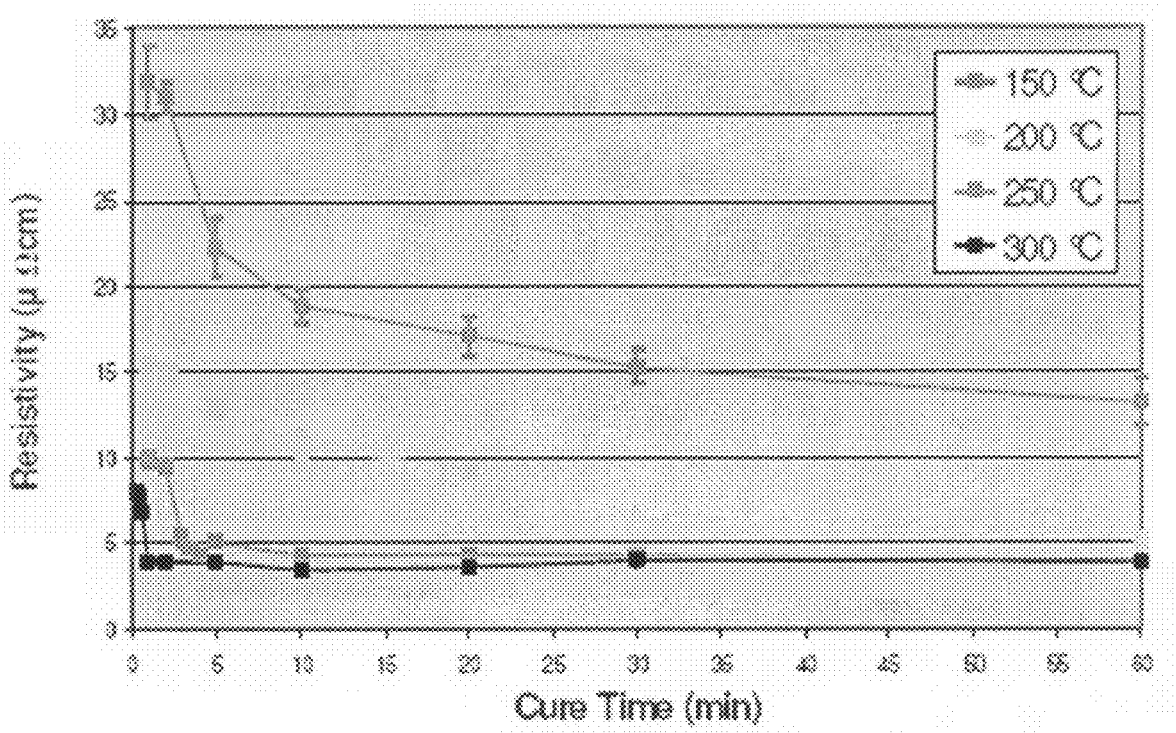
FIG. 6 is a plot of resistivity versus temperature and time for a commercially available silver ink.

The sinter/oxidation chamber has an atmosphere and a temperature suitable for both sintering the precursor cap layer 340 and oxidizing the intermediate superconductor layer 330. The minimum temperature sufficient to sinter the precursor cap layer 340 depends, among other things, on the size and composition of the deposited metal particles. For example, a minimum temperature sufficient to sinter silver nanoparticles, e.g., to form a substantially continuous layer having a resistivity and density comparable to that of conventionally deposited silver, is typically between about 200° C. and about 600° C. Silver nanoparticles with diameters on the order of 10 nm typically sinter at relatively low temperatures, e.g., about 200° C. Silver nanoparticles with diameters on the order of 200 nm typically sinter at relatively high temperatures, e.g., about 600° C. FIG. 6 is a plot of the resistivity of AG-IJ-G-100-S1 silver ink available from Cabot Corporation as a function of temperature and time.

The minimum temperature sufficient to oxidize the intermediate superconductor layer 330 may be somewhat higher than that needed to sinter the precursor cap layer, e.g., between about 500° C. and about 700° C. The appropriate temperature of the sinter/oxidation chamber is sufficiently high to achieve both processes, and so may be somewhat higher than the minimum temperature needed to perform sintering. The atmosphere within the chamber is selected to allow both processes to occur. Typically, the success of the sintering process is not significantly related to the atmosphere in which the metal particles are heated, so the appropriate atmosphere may be selected based mainly on the oxidation step. In some embodiments, the atmosphere is substantially pure oxygen at an appropriate pressure, e.g., about 1 atm. Appropriate atmospheres, temperatures, and reaction times sufficient to oxidize intermediate superconductor layers and thus form finished superconductor layers, are known in the art.

6. Stabilizer Strips

Next, as shown in FIG. 3E, filler 360 is used to optionally laminate stabilizer strip 370 to finished cap layer 351, filler 361 is used to optionally laminate stabilizer strip 371 to substrate 310. Stabilizer strips 370 and 371 can enhance the mechanical, thermal, and electrical stability of the finished HTS wire, for example by providing an architecture that is resilient to stress and which improves current density in the wire, as described in U.S. patent application Ser. No. 11/193, 262 and in U.S. Pat. No. 6,745,059. The stabilizer strips add thermal stability to the wire by providing additional heat capacity; add electrical stability by providing other paths for electric current in case of a damaged region of the superconductor layer; and add mechanical stability by reducing stress to the superconductor layer if the wire is bent. The material used for the stabilizer strips is selected to provide an appropriate stability to the fabricated wires for the desired application. The stabilizer strips are generally a flexible conductive material, e.g. metal, such as aluminum, copper, silver, nickel, iron, stainless steel, aluminum alloy, copper alloy, silver alloy, nickel alloy, nickel tungsten alloy, or iron alloy. For many applications, a high conductivity metal such as copper is preferred. For a fault current limiter application, a mechanically strong, high resistivity alloy such as stainless steel is preferred. The thicknesses of the stabilizer strips can be varied throughout a wide range of about 0.01-2 mm, depending upon the desired application. For superconducting cables, the thicknesses are typically between 0.05-0.075 mm. For a fault current limiter application, the stabilizer thicknesses can range from 0.025 mm to above 1 mm.

Filler 360 and 361 is typically electrically conductive and non-porous, e.g. solder or another low-melting temperature alloy or amalgam, a conductive polymer, or a pure metal such as In. An exemplary solder is Pb—Sn—Ag.

Figure 3F:
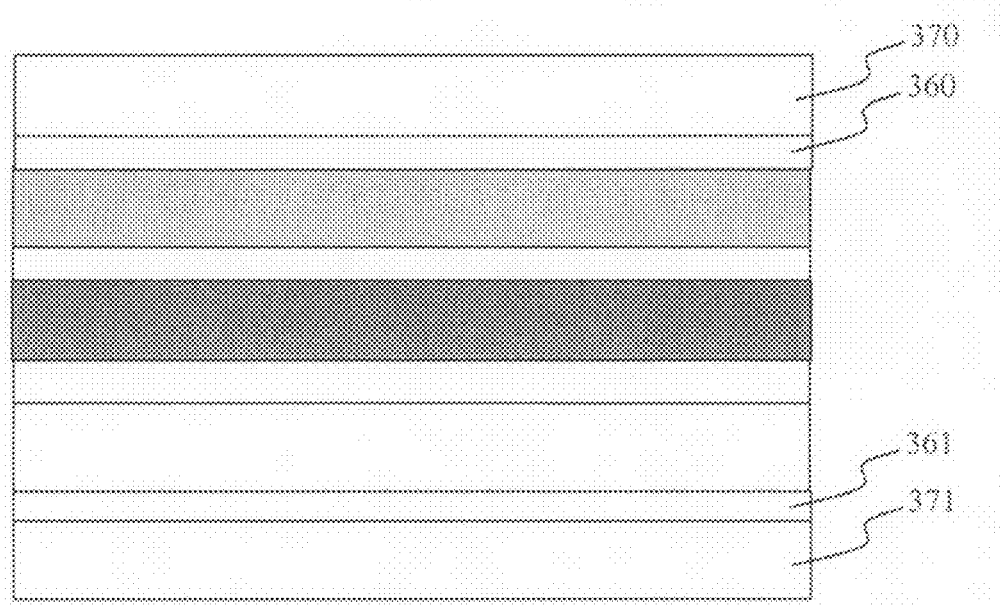
Figure 7:
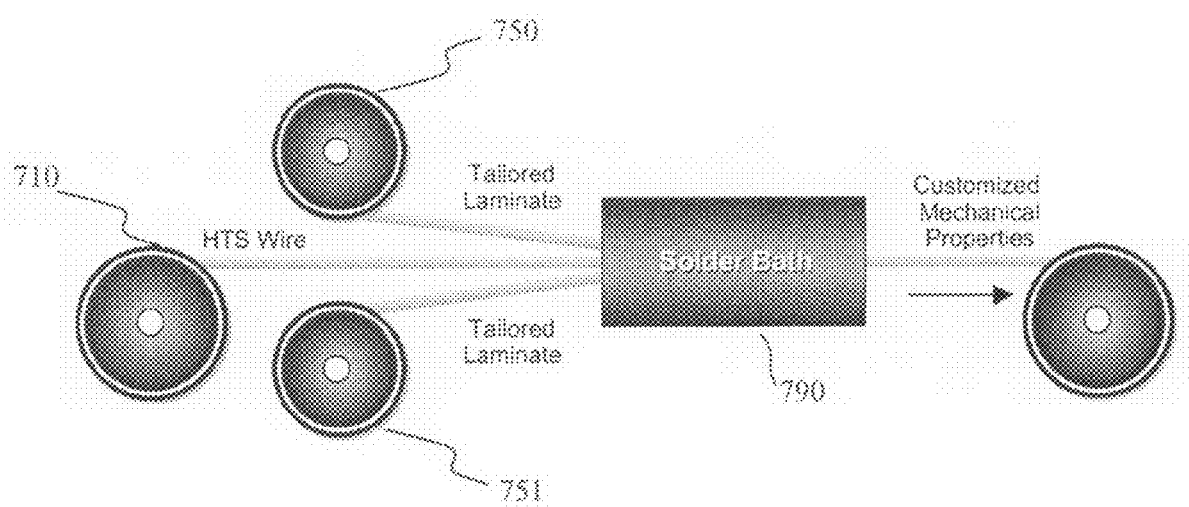
FIG. 7 shows a system for laminating stabilizer strips to a superconductor assembly according to one or more embodiments of the invention.

The stabilizer strips 370 and 371 can be laminated to the assembly of FIG. 3E as illustrated in FIG. 7. HTS assembly 710, which may be as illustrated in FIG. 3E, includes finished superconductor layer 331 and finished cap layer 351, is joined with stabilizers 750 and 751 in a bath of filler 690. Assembly 710 may be fed into the filler bath from a reel, and stabilizer strips 750 and 751 may be fed off of reels placed above and below the feed-in reel of assembly 710 so that the assembly and stabilizer strips form a stacked configuration, which is fed into filler bath 790 in the direction of the arrow. A die (not shown) presses assembly 710 to stabilizer strips 750 and 751, laminating the three together with filler 690, resulting in a structure as illustrated in FIG. 3F.

Although in the described embodiments, the finished HTS wire includes a single superconductor layer, in general the assembly can have more than one superconductor layer, and even more than one substrate. For example, U.S. patent application Ser. No. 11/193,262, entitled "Architecture for High Temperature Superconducting Wire" describes HTS wires that include two assemblies, each assembly having a superconductor layer, a buffer layer, a cap layer, and a stabilizer strip, that are laminated together by their substrates to form a multi-substrate assembly. It is contemplated that patterning the superconductor layer for each assembly as described herein, e.g., as filaments, would allow for wide multi-substrate assemblies to be cost-effectively fabricated and then slit into multiple sealed wires. Each wire would then include two or more superconductor layers, which can provide enhanced current-carrying capability and performance.

As discussed above, a second cap layer can be solution-deposited or otherwise applied to the back of the substrate in order to improve bonding between the substrate and the stabilizer strip 371.

EXAMPLES

The following examples are not intended to be limiting of the invention, but merely illustrative of various embodiments.

A first sample was produced by spin coating a commercially available silver nanoparticle ink (Cabot Corp. part # AG-IJ-G-100-S1, the composition of which is described above) onto a layer of intermediate YBCO at approximately 2,000 rpm. A second sample was produced by diluting a silver nanoparticle paste in ethanol (Ernest F. Fullam Inc. part # 14810, a silver paint composition including a colloidal slurry of silver particles in ethanol) and spin coating the resulting solution onto a comparable layer of intermediate YBCO at approximately 2,000 rpm. The final concentration was approximately 30%-60% by weight. The two samples were heated in an approximately 1 atm $O_2$ atmosphere for about 30 minutes, and cooled to room temperature over about 3 hours. The first sample was found to have an Ic of approximately 191 A/cm-width at 77K, and the second sample was found to have an Ic of approximately 180 A/cm-width at 77K.

A third sample was produced by depositing a thin barrier layer of approximately 0.5 μm of silver over an intermediate YBCO layer using conventional sputtering in a reel-to-reel system, and then slot-die coating the Cabot silver nanoparticle ink to a thickness of approximately 2.5 μm. The sample was heated in a ~1 atm $O_2$ atmosphere for about 30 minutes, and cooled to room temperature over about 3 hours. The third sample was found to have an Ic of approximately 500 A/cm-width at 77 K, which is comparable to the Ic obtained from comparable samples produced by conventionally sputtering or evaporating silver layers onto the same intermediate YBCO layer and subsequently oxidizing.

Fabricating HTS Wires

Figure 8:
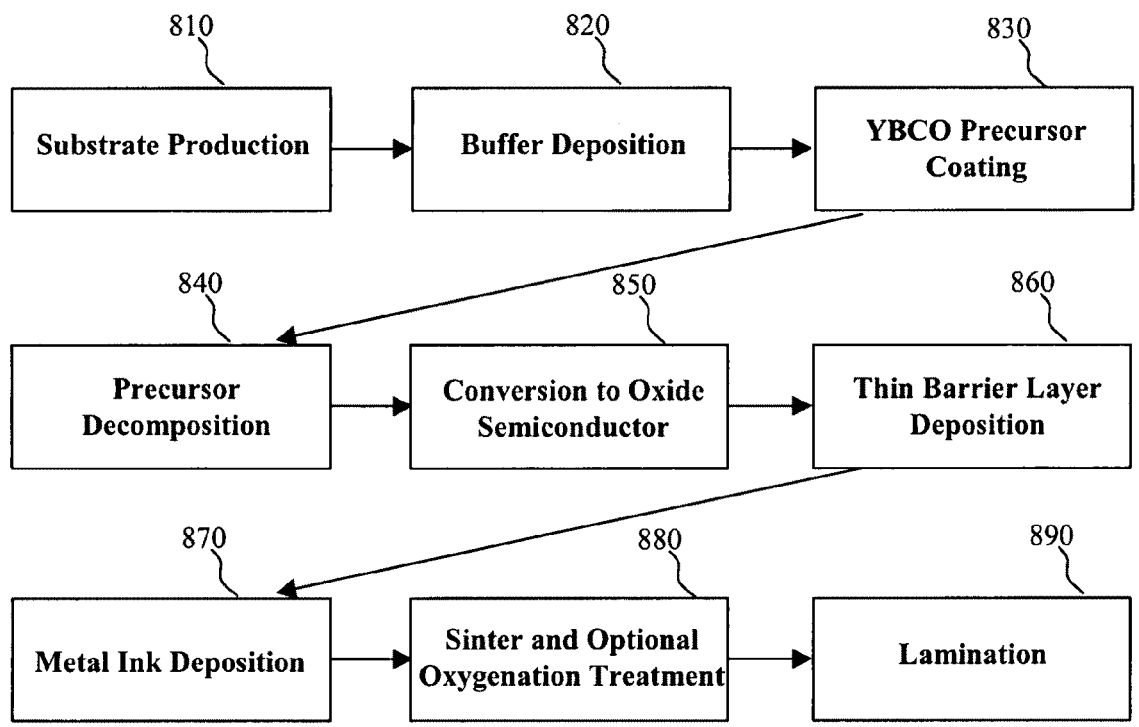
FIG. 8 is a schematic illustration of a system and process used to prepare an HTS wire according to one or more embodiments of the invention.

A web coating method of fabricating wires having the architecture $CeO_2/YSZ/Y_2O_3/NiW$ is shown in FIG. 8.

Textured Metal Substrate

The template is provided in widths of about 1 to 10 cm, or larger. Optionally, it is textured. A method of preparing a textured metal substrate suitable for use as a substrate for an HTS wire first is described. At a first station 810, a substrate is treated to obtain biaxial texture. Preferably, the substrate surface has a relatively well-defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of surface 110 have a FWHM of less than about 20° (e.g., less than about 15°, less than about 10°, or from about 5° to about 10°).

The surface of the substrate can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a tape or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quaternary alloy). In some of these embodiments, the alloy can contain one or more oxide formers (e.g., Mg, Al, Ti, Cr, Ga, Ge, Zr, Hf, Y, Si, Pr, Eu, Gd, Th, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g., annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g., Nb, Mo, Ta, V, Cr, Zr, Pd, Sb, NbTi, an intermetallic such as NiAl or Ni$_3$Al, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by pO$_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the substrate in a surface treatment. The sulfur can be formed on the surface of the substrate, for example, by exposing the intermediate layer to a gas environment containing a source of sulfur (e.g., H$_2$S) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about 1×10$^{-3}$ torr, less than about 1×10$^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., c(2×2)) can be formed by applying an appropriate organic solution to the surface of the intermediate layer by heating to an appropriate temperature in an appropriate gas environment. It can also be obtained by allowing sulfur, which can be added to the substrate material, to diffuse to the surface of the substrate.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

The substrate may also be untextured, for example, using Hastelloy or other commercial metals.

Buffer Layer

In a second processing station 820, a buffer layer is formed on the textured substrate.

Examples of buffer materials include metals and metal oxides, such as silver, nickel, TbO, $CeO_2$, yttria-stabilized zirconia (YSZ), $Y_2O_3$, $Gd_2O_3$, $LaAlO_3$, $SrTiO_3$, $LaNiO_3$, $LaCuO.sub.3$, $SrRuO_3$, $NdGaO_3$, $NdAlO_3$ and/or nitrides as known to those skilled in the art.

In certain embodiments, an epitaxial buffer layer can be formed using a low vacuum vapor deposition process (e.g., a process performed at a pressure of at least about $1 \times 10^3$ torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1 \times 10^{-3}$ torr, such as less than about $1 \times 10^{-4}$ torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1 \times 10^{-3}$ torr, at least about 0.1 torr, or at least about 1 torr) at a surface temperature below the temperature used to grow the epitaxial layer using physical vapor deposition at a high vacuum (e.g., at most about $1 \times 10^{-4}$ torr). The temperature of the target surface can be, for example, from about 25° C. to about 800° C. (e.g., from about 500° C. to about 800° C., or from about 500° C. to about 650° C.).

The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022,832, issued Feb. 8, 2000, and entitled "Low Vacuum Process for Producing Superconductor Articles with Epitaxial Layers;" and/or commonly owned U.S. patent application Ser. No. 09/007,372 filed Jan. 15, 1998, and entitled "Low Vacuum Process for Producing Epitaxial Layers of Semiconductor Material," all of which are hereby incorporated by reference.

In some embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as $Ar^+$ toward a substrate surface. Preferably, gridded ion sources with beam voltages greater than 150 eV are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate is made negative with respect to the anode potential, it will be subjected to a steady bombardment by ions from the gas prior to the deposition (if the target is shuttered) or during the entire film deposition. This ion bombardment can clean the substrate surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. One or more buffer layers, each including a single metal or oxide layer, can be used. In some preferred embodiments, the substrate is allowed to pass through an apparatus adapted to carry out steps of the deposition method of these embodiments. For example, if the substrate is in the form of a tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200° C. to 800° C., preferably 500° C. to 800° C., and more preferably, 650° C. to 800° C. Various well-known methods such as radiative heating, convection heating, and conduction heating are suitable for short (2 cm to 10 cm) lengths of substrate, but for longer (1 m to 100 m) lengths, these techniques may not be well suited. Also to obtain desired high throughput rates in a manufacturing process, the substrate must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes that contact the substrate in at least two different segments of the substrate. For example, if the substrate, in the form of a tape, is passed between reels, the reels themselves could act as electrodes. Alternatively, if guides are employed to transfer the substrate between reels, the guides could act as electrodes. The electrodes could also be completely independent of any guides or reels as well. In some preferred embodiments, current is applied to the substrate tape between current wheels.

In order that the deposition is carried out on a substrate that is at the appropriate temperature, the metal or oxide material that is deposited onto the substrate is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the substrate is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

More details are provided in commonly owned U.S. patent application Ser. No. 09/500,701, filed on Feb. 9, 2000, and entitled "Oxide Layer Method," and commonly owned U.S. patent application Ser. No. 09/615,669, filed on Jul. 14, 2000, and entitled "Oxide Layer Method," both of which are hereby incorporated by reference in their entirety.

In preferred embodiments, three buffer layers are used. A layer of $Y_2O_3$ or $CeO_2$ (e.g., from about 20 nanometers to about 75 nanometers thick) is deposited (e.g., using electron beam evaporation) onto the substrate surface. A layer of YSZ (e.g., from about 0.20 nanometers about 700 nanometers thick, such as about 75 nanometers thick) is deposited onto the surface of the $Y_2O_3$ or $CeO_2$ layer using sputtering (e.g., using magnetron sputtering). A $CeO_2$ layer (e.g., about 20 nanometers thick) is deposited (e.g., using magnetron sputtering) onto the YSZ surface. The surface of one or more of these layers can be chemically and/or thermally conditioned as described herein.

In certain embodiments, a buffer layer material can be prepared using solution phase techniques, including metalorganic deposition, which are known to those skilled in the art. Such techniques are disclosed in, for example, S. S. Shoup et al., J. Am. Cer. Soc., Vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

In certain embodiments, the buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 130 or less), both in-plane and out-of-plane.

The formation of oxide buffer layers can be carried out so as to promote wetting of an underlying substrate layer. Additionally, in particular embodiments, the formation of metal oxide layers can be carried out using metal alkoxide or carboxylate precursors (for example, "sol gel" precursors).

Precursor Layer

Once the textured substrate including buffer layers is prepared, a precursor solution is deposited at a station 830 as described above. One or more layers are deposited to form a precursor layer having the desired thickness and overall composition.

Suitable precursor components include soluble compounds of one or more rare earth elements, one or more alkaline earth metals and one or more transition metals. As used herein, "soluble compounds" of rare earth elements, alkaline earth metals and transition metals refers to compounds of these metals that are capable of dissolving in the solvents contained in the precursor solution. Such compounds include, for example, salts (e.g., nitrates, acetates, alkoxides, halides, sulfates, and trifluoroacetates), oxides and hydroxides of these metals. At least one of the compounds is a fluorine-containing compound, such as the trifluoroacetate.

Examples of metal salt solutions that can be used are as follows.

In some embodiments, the metal salt solution can have a relatively small amount of free acid. In aqueous solutions, this can correspond to a metal salt solution with a relatively neutral pH (e.g., neither strongly acidic nor strongly basic). The metal salt solution can be used to prepare multi-layer superconductors using a wide variety of materials that can be used as the underlying layer on which the superconductor layer is formed.

The total free acid concentration of the metal salt solution can be less than about $1\times10^{-3}$ molar (e.g., less than about $1\times10^{-5}$ molar or about $1\times10^{-7}$ molar). Examples of free acids that can be contained in a metal salt solution include trifluoroacetic acid, acetic acid, nitric acid, sulfuric acid, acids of iodides, acids of bromides and acids of sulfates.

When the metal salt solution contains water, the precursor composition can have a pH of at least about 3 (e.g., at least about 5 or about 7).

In some embodiments, the metal salt solution can have a relatively low water content (e.g., less than about 50 volume percent water, less than about 35 volume percent water, less than about 25 volume percent water).

In general, the rare earth metal salt can be any rare earth metal salt that is soluble in the solvent(s) contained in the precursor solution and that, when being processed to form an intermediate (e.g., a metal oxyhalide intermediate), forms rare earth oxide(s) (e.g., $Y_2O_3$). The rare earth elements may be selected from the group of yttrium, cerium, neodymium, samarium, europium, gadolinium, terbium, dysprosium, holmium, erbium, thulium, ytterbium, and lutetium. Typically, the alkaline earth metal is barium, strontium or calcium. Such salts can have, for example, the formula $M(O_2C-(CH_2)_n-CXX'X'')(O_2C-(CH_2)_m-CX'''X''''X''''')(O_2C-(CH_2)_p-CX''''''X'''''''X'''''''')$ or $M(OR)_3$. M is the rare earth metal. n, m and p are each at least one but less than a number that renders the salt insoluble in the solvent(s) (e.g., from one to ten). Each of X, X', X'', X''', X'''', X''''', X'''''', X''''''' and X'''''''' is H, F, Cl, Br or I. R is a carbon containing group, which can be halogenated (e.g., $CH_2CF_3$) or nonhalogenated. Examples of such salts include nonhalogenated carboxylates, halogenated acetates (e.g., trifluoroacetate, trichloroacetate, tribromoacetate, triiodoacetate), halogenated alkoxides, and nonhalogenated alkoxides. Examples of such nonhalogenated carboxylates include nonhalogenated acetates (e.g., $M(O_2C-CH_3)_3$). Generally, the alkaline earth metal salt can be any alkaline earth metal salt that is soluble in the solvent(s) contained in the precursor solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g., BaO). Such salts can have, for example, the formula $M'(O_2C-(CH_2)_n-CXX'X'')(O_2C-(CH_2)_m-CX'''X''''X''''')$ or $M'(OR)_2$. M' is the alkaline earth metal. n and m are each at least one but less than a number that renders the salt insoluble in the solvent(s) (e.g., from one to ten). Each of X, X', X'', X''', X'''' and X''''' is H, F, Cl, B or, I. R can be a halogenated or nonhalogenated carbon containing group. Examples of such salts include halogenated acetates (e.g., trifluoroacetate, trichloroacetate, tribromoacetate, triiodoacetate). Generally, the transition metal is copper. The transition metal salt should be soluble in the solvent(s) contained in the precursor solution. In one or more embodiments of the present invention, the rare earth and the alkaline earth elements can form a metal or mixed metal oxyfluoride in place of or in addition to a rare earth oxide and an alkaline earth fluoride.

Suitable copper precursor solutions contain a copper salt that is soluble at the appropriate concentration in the solvent(s). Such compounds include copper nitrates, carboxylates, alkoxides, halides, sulfates or trifluoroacetates. Preferably, during conversion of the precursor to the intermediate (e.g., metal oxyhalide), minimal cross-linking occurs between discrete transition metal molecules (e.g., copper molecules). Such transition metals salts can have, for example, the formula $M''(CXX'X''-CO(CH)_aCO-CX'''X''''X''''')(CX''''''X'''''''X''''''''-CO(CH)_bCO-CX'''''''''X'''''''''')$, $M''(O_2C-(CH_2)_n-CXX'X'')(O_2C-(CH_2)_m-CX'''X''''X''''')$ or $M''(OR)_2$. M'' is the transition metal. a and b are each at least one but less than a number that renders the salt insoluble in the solvent(s) (e.g., from one to five). Generally, n and m are each at least one but less than a number that renders the salt insoluble in the solvent(s) (e.g., from one to Br or I. R is a carbon containing group, which can be halogenated (e.g., $CH_2CF_3$) or nonhalogenated. These salts include, for example, nonhalogenated actetates (e.g., $M''(O_2C-CH_3)_2$), halogenated acetates, halogenated alkoxides, and nonhalogenated alkoxides. Examples of such salts include copper trichloroacetate, copper tribromoacetate, copper triiodoacetate, $Cu(CH_3COCHCOCF_3)_2$, $Cu(OOCC_7H_{15})_2$, $Cu(CF_3COCHCOF_3)_2$, $Cu(CH_3COCHCOCH_3)_2$, $Cu(CH_3CH_2CO_2CHCOCH_3)_2$, $CuO(C_5H_6N)_2$ and $Cu_3O_3Ba_2(O-CH_2CF_3)_4$. A suitable compound is copper proprionate. An example of a nonhalogenated propionate salt of a transition metal is $CU(O_2CC_2H_5)_2$. In some embodiments, the transition metal salt is a simple salt, such as copper sulfate, copper nitrate, copper iodide and/or copper oxylate. In some embodiments, n and/or m can have the value zero. In certain embodiments, a and/or b can have the value zero. An illustrative and nonlimiting list of Lewis bases includes nitrogen-containing compounds, such as ammonia and amines. Examples of amines include $CH_3CN$, $C_5H_5N$ and $R_1R_2R_3N$. Each of $R_1R_2R_3$ is independently H, an alkyl group (e.g., a straight chained alkyl group, a branched alkyl group, an aliphatic alkyl group, a non-aliphatic alkyl group and/or a substituted alkyl group) or the like. Without wishing to be bound by theory, it is believed that the presence of a Lewis base in the metal salt solution can reduce cross-linking of copper during intermediate formation. It is believed that this is achieved because a Lewis base can coordinate (e.g., selective coordinate) with copper ions, thereby reducing the ability of copper to cross-link.

While the precursor solution typically contains stoichiometric amounts of the component metal compounds, i.e., 3:2:1 Cu:Ba:RE, in some embodiments an excess of copper or a deficiency of barium is used. The ratio of the transition metal to the alkaline earth metal can be greater than 1.5, and the precursor solution can include at least about 5 mol % excess copper, or at least about 20 mol % excess copper.

In addition to precursor components for the formation of a rare-earth/alkaline-earth-metal/transition-metal oxide, the precursor solution may include additive components and/or dopant components for the formation of flux pinning sites is used in a solution-based method to obtain a superconducting film having pinning centers. The additive compound can be metal compounds, such as soluble compounds of rare earths, alkaline earths or transition metals, cerium, zirconium, silver, aluminum, or magnesium, that form metal oxide or metal in the oxide superconductor film. The precursor solution can provide a dopant metal that partially substitutes for a metal of the precursor component of the precursor solution. Generally, a dopant component can be any metal compound that is soluble in the solvent(s) contained in the precursor solution and that, when processed to form an oxide superconductor, provided a dopant metal that substitutes for an element of the oxide superconductor.

The solvent or combination of solvents used in the precursor solution can include any solvent or combination of solvents capable of dissolving the metal salts (e.g., metal carboxylate(s)). Such solvents include, for example, alcohols or acids, including methanol, ethanol, isopropanol and butanol, propionic acid or water.

In embodiments in which the metal salt solution contains trifluoroacetate ion and an alkaline earth metal cation (e.g., barium), the total amount of trifluoroacetate ion can be selected so that the mole ratio of fluorine contained in the metal salt solution (e.g., in the form of trifluoroacetate) to the alkaline earth metal (e.g., barium ions) contained in the metal salt solution is at least about 2:1 (e.g., from about 2:1 to about 18.5:1, or from about 2:1 to about 10:1).

The methods of disposing the superconducting composition on the underlying layer (e.g., on a surface of a substrate, such as a substrate having an alloy layer with one or more buffer layers disposed thereon) include spin coating, dip coating, slot coating, web coating and other techniques known in the art.

Decomposition of the Precursor Layer

At a subsequent station 840, the precursor components are decomposed to form an oxyfluoride layer. The conversion of the precursor components into an oxide superconductor is carried out as has been previously reported for continuous thick precursor films. In the case of precursor components including at least one fluoride-containing salt, the first step of the heating step is performed to decompose the metalorganic molecules to one or more oxyfluoride intermediates of the desired superconductor material.

An oxyfluoride film is considered to be any film that is a precursor to a rare earth metal-alkaline earth metal-transition metal oxide superconductor (hereinafter "RE-123") film that includes (1) a mixture of $BaF_2$, a rare earth oxide or fluoride and/or transition metal, transition metal oxide or transition metal fluoride, (2) a mixture of a compound including a RE-Ba—O—F phase, a rare earth oxide or fluoride and/or transition metal oxide or fluoride, or (3) as a mixture of a compound including a Ba—O—F phase, rare earth oxides or fluorides and/or transition metal oxide or fluoride. The oxyfluoride film can then be further processed to form a RE-123 oxide superconductor film. The oxide superconductor film also indicates a small, but detectable, fluoride residue.

Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 torr to about 50 torr, more preferably at from about 5 torr to about 30 torr, and most preferably at from about 20 torr to about 30 torr. The partial pressure of oxygen in the nominal gas environment is maintained at from about 0.1 torr to about 760 torr and preferably at about 730-740 torr.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 torr to about 50 torr water vapor (e.g., from about 5 torr to about 30 torr water vapor, or from about 10 torr to about 25 torr water vapor). The nominal partial pressure of oxygen can be, for example, from about 0.1 torr to about 760 torr. In these embodiments, heating is then continued to a temperature of from about 220° C. to about 290° C. (e.g., about 220° C.) in a water vapor pressure of from about 5 torr to about 50 torr water vapor (e.g., from about 5 torr to about 30 torr water vapor, or from about 10 torr to about 25 torr water vapor). The nominal partial pressure of oxygen can be, for example, from about 0.1 torr to about 760 torr. This is followed by heating to about 400° C. at a rate of at least about 2° C. per minute (e.g., at least about 3° C. per minute, or at least about 5° C. per minute) in a water vapor pressure of from about 5 torr to about 50 torr water vapor (e.g., from about 5 torr to about 30 torr water vapor, or from about 10 torr to about 25 torr water vapor) to form barium fluoride. The nominal partial pressure of oxygen can be, for example, from about 0.1 torr to about 760 torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 torr, a predetermined partial pressure of water vapor (e.g. at least about 10 torr, at least about 15 torr, at most about 25 torr, at most about 20 torr, about 17 torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C.

per minute, about 10° C. per minute). This step can be performed with the same nominal gas environment used in the first heating step.

The foregoing treatments of a metal salt solution can result in an oxyfluoride film in which the constituent metal oxides and metal fluorides are homogeneously distributed throughout the film. Preferably, the film has a relatively low defect density and is essentially free of cracks through its thickness. While solution chemistry for barium fluoride formation has been disclosed, other methods can also be used for other precursor solutions.

Forming the Oxide Superconductor

The oxyfluoride film can then be heated to form an oxide superconductor layer at a further processing station 850. Typically, this step is performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the oxyfluoride film. During this step, a process gas is flowed over the film surface to supply the gaseous reactants to the film and to remove the gaseous reaction products from the film. The nominal gas environment during this step has a total pressure of about 0.1 torr to about 760 torr and includes about 0.09 torr to about 50 torr oxygen and about 0.01 torr to about 150 torr water vapor and about 0 torr to about 750 torr of an inert gas (nitrogen or argon). More preferably, the nominal gas environment has a total pressure of about 0.15 torr to about 5 torr and includes about 0.1 torr to about 1 torr oxygen and about 0.05 torr to about 4 torr water vapor.

The film is then held at a temperature of about 700° C.-825° C., preferably at a temperature of about 740° C. to 800° C. and more preferably at a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 torr to about 760 torr and includes about 0.09 torr to about 50 torr oxygen and about 0.01 torr to about 150 torr water vapor and about 0 torr to about 750 torr of an inert gas (nitrogen or argon). More preferably, the nominal gas environment has a total pressure of about 0.15 torr to about 5 torr and includes about 0.1 torr to about 1 torr oxygen and about 0.05 torr to about 4 torr water vapor.

The film is then cooled to room temperature in a nominal gas environment with an oxygen pressure of about 0.05 torr to about 150 torr, preferably about 0.1 torr to about 0.5 torr and more preferably from about 0.1 torr to about 0.2 torr.

The resultant oxide superconductor layer is well ordered (e.g., biaxially textured in plane, or c-axis out of plane and biaxially textured in plane). In some embodiments, the bulk of the superconductor material is biaxially textured. A superconductor layer can be at least about one micrometer thick (e.g., at least about two micrometers thick, at least about three micrometers thick, at least about four micrometers thick, at least about five micrometers thick). The oxide superconductor has a c-axis orientation that is substantially constant across its width, the c-axis orientation of the superconductor being substantially perpendicular to the surface of the wire or tape.

The oxide superconductor layer can also be deposited in-situ (no precursor deposition and separate reaction steps) by laser ablation, MOCVD, or other techniques known in the art.

The oxide superconductor layer formed at station 850 is typically oxygen-deficient, i.e., requires additional oxygenation in order to form the desired superconductor phase, for example to convert a $YBa_2Cu_3O_{6.5}$ composition to a superconducting $YBa_2Cu_3O_{7-x}$ composition. In some embodiments, the oxide superconductor layer is oxygenated at station 850 using techniques well known in the art. In other embodiments, the oxide superconductor layer is not oxygenated at station 850, but instead is oxygenated during the sintering of the solution-deposited cap layer, as discussed in greater detail above.

Further Processing

Further processing by deposition of thin barrier layer at station 860; metal ink deposition at station 870; sinter and optional oxidation (if oxidation was not performed at station 850) at station 880; and optional lamination to a stabilizer strip at station 890 are carried out to form a finished HTS wire according to one or more embodiments of the invention.

INCORPORATION BY REFERENCE

The following documents are hereby incorporated by reference in their entireties: U.S. Pat. No. 5,231,074, issued on Jul. 27, 1993, and entitled "Preparation of Highly Textured Oxide Superconducting Films from MOD Precursor Solutions;" U.S. Pat. No. 6,022,832, issued Feb. 8, 2000, and entitled "Low Vacuum Process for Producing Superconductor Articles with Epitaxial Layers;" U.S. Pat. No. 6,027,564, issued Feb. 22, 2000, and entitled "Low Vacuum Process for Producing Epitaxial Layers;" U.S. Pat. No. 6,190,752, issued Feb. 20, 2001, and entitled "Thin Films Having Rock-Salt-Like Structure Deposited on Amorphous Surfaces;" U.S. Pat. No. 6,537,689, issued Mar. 25, 2003, and entitled "Multi-Layer Superconductor Having Buffer Layer With Oriented Termination Plane;" PCT Publication No. WO 00/58530, published on Oct. 5, 2000, and entitled "Alloy Materials;" PCT Publication No. WO/58044, published on Oct. 5, 2000, and entitled "Alloy Materials;" PCT Publication No. WO 99/17307, published on Apr. 8, 1999, and entitled "Substrates with Improved Oxidation Resistance;" PCT Publication No. WO 99/16941, published on Apr. 8, 1999, and entitled "Substrates for Superconductors;" PCT Publication No. WO 98/58415, published on Dec. 23, 1998, and entitled "Controlled Conversion of Metal Oxyfluorides into Superconducting Oxides;" PCT Publication No. WO 01/11428, published on Feb. 15, 2001, and entitled "Multi-Layer Articles and Methods of Making Same;" PCT Publication No. WO 01/08232, published on Feb. 1, 2001, and entitled "Multi-Layer Articles And Methods Of Making Same;" PCT Publication No. WO 01/08235, published on Feb. 1, 2001, and entitled "Methods And Compositions For Making A Multi-Layer Article;" PCT Publication No. WO 01/08236, published on Feb. 1, 2001, and entitled "Coated Conductor Thick Film Precursor;" PCT Publication No. WO 01/08169, published on Feb. 1, 2001, and entitled "Coated Conductors With Reduced A. C. Loss;" PCT Publication No. WO 01/15245, published on Mar. 1, 2001, and entitled "Surface Control Alloy Substrates And Methods Of Manufacture Therefore;" PCT Publication No. WO 01/08170, published on Feb. 1, 2001, and entitled "Enhanced Purity Oxide Layer Formation;" PCT Publication No. WO 01/26164, published on Apr.

12, 2001, and entitled "Control of Oxide Layer Reaction Rates;" PCT Publication No. WO 01/26165, published on Apr. 12, 2001, and entitled "Oxide Layer Method;" PCT Publication No. WO 01/08233, published on Feb. 1, 2001, and entitled "Enhanced High Temperature Coated Superconductors;" PCT Publication No. WO 01/08231, published on Feb. 1, 2001, and entitled "Methods of Making A Superconductor;" PCT Publication No. WO 02/35615, published on Apr. 20, 2002, and entitled "Precursor Solutions and Methods of Making Same;" PCT Publication No. WO 2005/121414, published on Dec. 22, 2005, and entitled "Deposition of Buffer Layers on Textured Metal Surfaces;" PCT Publication No. WO 2005/081710, published on Sep. 9, 2005, and entitled "Oxide Films with Nanodot Flux Pinning Sites;" U.S. Pat. No. 6,436,317, issued Aug. 20, 2002, and entitled, "Oxide Bronze Compositions And Textured Articles Manufactured In Accordance Therewith;" U.S. Provisional Patent Application Ser. No. 60/309,116, filed on Jul. 31, 2001, and entitled "Multi-Layer Superconductors And Methods Of Making Same;" U.S. Pat. No. 6,797,313, issued Sep. 28, 2004, and entitled "Superconductor Methods and Reactor;" U.S. Pat. No. 6,669,774, issued Dec. 30, 2003, entitled "Methods and Compositions for Making a Multi-Layer Article;" U.S. Pat. No. 6,974,501, issued Dec. 13, 2005, and entitled "Multi-Layer Articles and Methods of Making Same;" U.S. Pat. No. 6,893,732, issued May 17, 2005, entitled "Multi-Layer Articles and Methods of Making Same;" U.S. Patent publication 2006/0040829, published on Feb. 23, 2006, entitled "Dropwise Deposition of a Patterned Oxide Superconductor;" U.S. Patent publication 2006/0040830, published on Feb. 3, 2006, entitled "Low AC Loss Filamentary Coated Superconductors;" U.S. Patent publication 2006/0073975, published on Apr. 6, 2006, entitled "Stacked Filamentary Coated Superconductors;" U.S. Patent publication 2006/0073979, published on Apr. 6, 2006, entitled "Architecture for High Temperature Superconductor Wire;" U.S. patent application Ser. No. 11/394,917, filed on Mar. 31, 2006, "Mesh-Type Stabilizer for Filamentary Coated Superconductors;" and U.S. Patent publication 2006/0094603, published May 4, 2006, entitled "Thick Superconductor Films with Improved Performance.

It will be further appreciated that the scope of the present invention is not limited to the above-described embodiments, but rather is defined by the appended claims, and that these claims will encompass modifications of and improvements to what has been described.

What is claimed is:

1. A method of making a high temperature superconductor wire, the method comprising: providing an oxide superconductor layer overlaying an upper surface of a substrate; forming through physical vapor deposition a substantially continuous barrier layer over the oxide superconductor layer, the barrier layer comprising metal; depositing a layer of metal particles over the barrier layer, said depositing comprising applying a liquid comprising metal particles over the barrier layer; and sintering the layer of metal particles to form a substantially continuous metal layer over the barrier layer.

2. The method of claim 1, wherein the oxide superconductor layer is oxygen-deficient.

3. The method of claim 2, further comprising oxidizing the oxygen-deficient oxide superconductor layer.

4. The method of claim 3, wherein at least a portion of said sintering and said oxidizing occurs simultaneously.

5. The method of claim 4, comprising performing said sintering and said oxidizing at an oxygen partial pressure and a temperature sufficient both to sinter the layer of metal particles and to oxidize the oxygen-deficient oxide superconductor layer.

6. The method of claim 1, comprising forming the barrier layer with sufficient thickness so as to substantially prevent the liquid from contacting the oxide superconductor layer.

7. The method of claim 6, wherein the barrier layer is between about 10 nm and about 500 nm thick.

8. The method of claim 1, wherein the physical vapor deposition comprises one of sputtering and evaporation.

9. The method of claim 1, wherein the barrier layer comprises a noble metal.

10. The method of claim 1, wherein the barrier layer comprises silver.

11. The method of claim 1, wherein depositing the liquid comprises one of slot-die coating, dip coating, spray coating, Gravure printing, screen printing, ink-jet printing, and doctor-blading.

12. The method of claim 1, further comprising forming a substantially continuous metal layer on a lower surface of the substrate.

13. The method of claim 1, wherein the metal particles comprise metal nanoparticles.

14. The method of claim 13, wherein at least some of the nanoparticles have a diameter between about 10 nm and about 200 nm.

15. The method of claim 1, wherein a first portion of said metal particles has a first composition, and wherein a second portion of said metal particles has a second composition.

16. The method of claim 15, wherein sintering the metal particles forms an alloy between the first composition and the second composition.

17. The method of claim 1, wherein the metal particles include at least one of silver, gold, copper, nickel, magnesium, palladium, platinum, cadmium, and mixtures thereof.

18. The method of claim 1, wherein the liquid comprises at least one of water and an organic solvent.

19. The method of claim 1, further comprising laminating a stabilizer layer to the cap layer.

20. The method of claim 1, wherein the liquid comprises at least one of a surfactant and a pH-adjusting agent.

21. The method of claim 1, further comprising providing at least one buffer layer interposed between the oxide superconductor layer and the upper surface of the substrate.

22. The method of claim 1, further comprising patterning the layer of metal particles.

23. A method of making a high temperature superconductor wire, the method comprising: providing an oxide superconductor layer overlaying an upper surface of a substrate; forming through physical vapor deposition a substantially continuous barrier layer over the intermediate superconductor layer, the barrier layer comprising metal; depositing a metalorganic composition over the barrier layer, said depositing comprising applying a liquid comprising a metalorganic compound dissolved in a solvent over the barrier layer; and sintering the deposited metalorganic composition to form a substantially continuous metal layer over the barrier layer.

24. The method of claim 23, wherein the metalorganic compound comprises at least one of silver acetylacetonate and silver nitrate.

* * * * *